United States Patent [19]

Zook

[11] Patent Number: 5,544,178

[45] Date of Patent: Aug. 6, 1996

[54] METHOD AND APPARATUS FOR ENCODING DATA IN A PRML CLASS-IV DIGITAL COMMUNICATION CHANNEL

[75] Inventor: Christopher P. Zook, Longmont, Colo.

[73] Assignee: Cirrus Logic, Inc., Fremont, Calif.

[21] Appl. No.: 258,308

[22] Filed: Jun. 10, 1994

[51] Int. Cl.$^6$ .................................................. H03M 13/12
[52] U.S. Cl. .................................................. 371/43; 341/59
[58] Field of Search ......................... 371/43, 49.1, 55, 371/57.2; 341/58, 59

[56] References Cited

U.S. PATENT DOCUMENTS

| | | | |
|---|---|---|---|
| 3,631,471 | 12/1971 | Griffiths | 341/93 |
| 4,413,251 | 11/1983 | Adler et al. | 341/59 |
| 4,547,890 | 10/1985 | Gindi | 341/58 |
| 4,617,552 | 10/1986 | Kojima et al. | 341/68 |
| 4,707,681 | 11/1987 | Eggenberger et al. | 341/59 |
| 4,779,072 | 10/1988 | van Gestel | 341/59 |
| 4,786,890 | 11/1988 | Marcus et al. | 341/81 |
| 4,833,471 | 5/1989 | Tokuume et al. | 341/67 |
| 5,196,848 | 3/1993 | Sakazaki | 341/51 |
| 5,241,309 | 8/1993 | Cideciyan | 341/59 |

*Primary Examiner*—Stephen M. Baker
*Attorney, Agent, or Firm*—Howard S. Sheerin

[57] ABSTRACT

A method and apparatus for encoding, detecting and decoding data in a Partial Response (PR) class-IV magnetic recording storage system that does not require the conventional interleave constraint and therefore minimizes the path memory and latency of a sequence detector such as the Maximum Likelihood (ML) Viterbi detector. Rather than encoding an interleave constraint to ensure merging of path memories, in the detector, the parity of the encoded codewords is utilized in selecting the correct sequence out of the unmerged paths. The encoding technique encodes the data using two groups of codewords: the first group causes the path memories of the sequence detector to merge into one survivor sequence, and the second group causes the path memories to merge into two survivor sequences different in only one bit and thus different in parity. The correct survivor sequence is thereby selected according to the parity of the codeword being detected. Parity is determined during the encoding process such that codewords from the second group follow codewords with even or odd parity. By looking ahead to the following codeword during the detection process, the parity of the current codeword being detected is determined and the correct survivor sequence selected. Further, the encoding technique provides the ability to correct for certain errors in the detected sequence when a "1" bit is erased due to noise in the system.

42 Claims, 14 Drawing Sheets

METHOD AND APPARATUS FOR ENCODING DATA IN A PRML CLASS-IV DIGITAL COMMUNICATION CHANNEL

FIELD OF INVENTION

This invention relates to computer technology and more specifically to systems for storing and retrieving digitized data on magnetic storage media.

CROSS REFERENCE TO RELATED APPLICATIONS AND PATENTS

This application is related to U.S. patent application Ser. No. 08/257,853 entitled "Method and Apparatus for Detecting and Decoding Data in a PRML Class-IV Digital Communication Channel". The above-named patent application is assigned to the same entity.

BACKGROUND OF THE INVENTION

The application of Partial Response Maximum Likelihood (herein after PRML) techniques to digital communication channels is well documented. See Y. Kabal and S. Pasupathy, "Partial Response Signaling", IEEE Trans. Commun. Tech., Vol. COM-23, pp.921–934, September 1975; Edward A. Lee and David G. Messerschmitt, "Digital Communication", Kluwer Academic Publishers, Boston, 1990; and G. D. Forney, Jr., "The Viterbi Algorithm", Proc. IEEE, Vol. 61, pp. 268–278, March 1973. Applying PRML techniques to magnetic storage systems is also well documented. See Roy D. Cideciyan, Francois Dolivo, Walter Hirt, and Wolfgang Schott, "A PRML System for Digital Magnetic Recording", IEEE Journal on Selected Areas in Communications, Vol. 10 No. 1, January 1992, pp.38–56; Wood et al, "Viterbi Detection of Class IV Partial Response on a Magnetic Recording Channel", IEEE Trans. Commun., Vol. Com-34, No. 5, pp. 454–461, May 1986; and Coker Et al, "Implementation of PRML in a Rigid Disk Drive", IEEE Trans. on Magnetics, Vol. 27, No. 6, November 1991.

In magnetic storage systems, a transducing head writes digital data onto the surface of a magnetic storage medium, such as a magnetic disk. The digital data serves to modulate the current in the head coil in writing a sequence of corresponding magnetic flux transitions which represent the digital data. When reading the recorded data, the head again passes over the magnetic medium and transduces the magnetic transitions into pulses in an analog read signal, which are then decoded by read channel circuitry to reproduce the digital sequence.

Decoding the pulses into a digital sequence can be performed by a simple pulse detector read channel or, as in more recent designs, by a partial response maximum likelihood (PRML) read channel. The PRML read channel scheme is preferred over the simpler pulse detection scheme because it decreases the necessary bandwidth, thereby allowing more data to be stored on the storage medium.

In conventional peak detection as well as PRML schemes, a channel code provides clocking and automatic gain control (AGC) information. To perform the timing and gain control, the number of consecutive zero samples must be limited since timing and gain control information is derived only when non-zero samples are read from the channel. Typically, an RLL code having a (d,k) constraint, which specifies the minimum and maximum run lengths of zeros respectively, encodes the data before recording it to the storage medium. For instance, a byte oriented (d=0, k=4) 8/9 code encodes binary data represented as 8 bit data bytes into 9 bit codewords in order to achieve the desired (d,k) constraint. Because he PRML technique utilizes inter-symbol interference (ISI) in a controlled manner, the d constraint in partial response class-IV channels is unnecessary (d=0). However the k constraint is still necessary in class-IV systems to provide the timing and gain control information.

The sampled data in partial response (PR) channels is typically converted into a digital sequence using maximum likelihood (ML) detection techniques (thus PRML). A Viterbi sequence detector normally implements the maximum likelihood Viterbi algorithm for detecting the digital sequence from the sampled data. See G. D. Forney, Jr., "The Viterbi Algorithm", Proc. IEEE, Vol. 61, pp. 268–278, March 1973, Prior art implementations of encoders and Viterbi sequence detectors in Partial Response class-IV channels introduced an additional constraint on the number of consecutive zeros in each of the even and odd interleaves of the encoded data in order to minimize the path memory of the detector. Thus the conventional modulation codes for PR class-IV systems utilizing Viterbi detection are characterized by (d,k/k1) where k1 represents the maximum run length of zeroes in both the even and odd subsequences. A small value of k is desirable for accurate timing and gain control, and a small value of k1 reduces the size of the path memory in the Viterbi detector. A method for encoding the channel data according to the (d,k/k1) constraints is described in U.S. Pat. No. 4,707,681, the disclosure of which is herein incorporated by reference.

FIG. 3 shows an example trellis diagram for the 1-D$^2$ PR class-IV channel and the effect the k1 constraint has on the path memory length of the Viterbi detector. As shown in the diagram, the path memories merge into one survivor sequence only after a "1" has been detected in both the even 40 and odd 42 interleaves. Therefore, in prior art implementations the length of the Viterbi detector path memories must be greater than 2(k1+1)+1 to guarantee that the paths merge into the correct sequence 34.

A further problem with the prior art implementations is that a minimum delay of 2(k1+1)+1 samples is required before the paths merge and the correct sequence is available. This latency degrades the performance of the storage systems; for instance, it increases the delay between reading the ID field and writing data to the disk. The latency also degrades the performance of other read channel components that use the output of the sequence detector, such as servo control.

Another problem with the prior art is the inability to correct errors in the data samples due to noise. For instance, if noise in the system causes a "1" to be erased, the path memories of the Viterbi detector may not be merged after 2(k1+1)+1 samples and the detected sequence may not be correct.

It is a general object of the present invention to provide a method and apparatus for processing data in a PR class-IV communication channel that does not require the conventional k1 constraint, thereby minimizing the path memory and latency of the Viterbi detector. Another object of the invention is to correct the errors in the detected sequence when a "1" is erased due to noise in the system.

SUMMARY OF THE INVENTION

The objects of the present invention are achieved by a novel method and apparatus for encoding, detecting and decoding data in a PR class-IV magnetic recording channel. The data is encoded using run length limited (RLL) (d,k) coding without the conventional k1 constraint (i.e., there is no interleave constraint on the maximum number of consecutive zeros). There are two preferred embodiments of the present invention: the first embodiment uses minimum path memory and minimizes the latency of the Viterbi detector but does not correct for errors due to noise, and the second embodiment corrects for errors but uses more path memory and has more latency.

In the minimum latency embodiment, the codewords are divided into three sets. The first set contains codewords having at least one "1" bit in both the even and odd interleave within a predetermined first N number of bits. The second set contains codewords having at least one "1" bit in the even interleave and zero "1" bits in the odd interleave within the first N number of bits. The third set contains codewords having at least one "1" bit in the odd interleave and zero "1" bins in the even interleave within the first N number of bits.

The path memories of the minimum latency embodiment are N+n long where n is the number of bits in a codeword (e.g., 9 in a 8/9 code). Thus the path memories are long enough to store N bits out of a current codeword, and n (i.e. all) bits of the previous codeword. Because the codewords in the first set contain a "1" in both interleaves within the first N bits, the path memories prior to the two "1" bits are guaranteed to have merged. That is, the codeword detected previous to the N bits of the current codeword is guaranteed to be available in the merged part of the path memories as shown in FIG. 5a.

The codewords in the second set, having at least one "1" bit in the even interleave within the first N bits of the codeword, guarantees that the path memories storing the even interleave of the previous codeword will be the same and the odd interleave will be different in only one bit as shown in FIG. 5b. Similarly, the codewords in the third set, having at least one "1" bit in the odd interleave within the first N bits of the codeword, guarantees that the path memories storing the odd interleave of the previous codeword will be the same and the even interleave will be different in only one bit as shown in FIG. 5c.

Since the path memories storing the previous codeword are different in only one bit when followed by a codeword from either the second or third set, the correct path can be selected by knowing he parity of the previous codeword as determined by which set the following codeword belongs. For instance, if codewords from the second set always follow codewords with even parity, and codewords from the third set always follow codewords with odd parity, the correct sequence for the previous codeword can be determined by choosing the path with the correct parity. The encoding method and apparatus of the present invention ensures that codewords with an even or odd parity are followed by codewords from the correct set.

By encoding the data according to the present invention, the correct sequence for the previous codeword can be determined before the path memories merge, thereby minimizing the latency of the Viterbi detector. Compared to the prior art implementations having a latency of 2(k1+1)+1 bits, the latency of the present invention is N bits. Thus if K1=4 and N=3, the latency of the present invention is approximately four times less than the prior art.

In the error correcting embodiment of the present invention, the path memories are long enough to store M+n bits, where M is greater than N in the first embodiment. The codewords are again divided into three sets. The first set has an additional property of at least two "1" bits in both the even and odd interleaves within a predetermined first M bits of the codeword. The second and third set have an additional property of at least one "1" bit in one of the interleaves and less than two "1" bits in the other interleave within the first M bits of the codeword.

If the codeword out of the second or third set has only one "1" bit in either interleave within the M bits, and that "1" bit is erased, the path memories storing the previous codeword will not have merged. However, since the parity of the previous codeword is known, the correct path can still be chosen and the errors caused by choosing the wrong path in the prior art implementations avoided.

Two example codes corresponding to the two embodiments are disclosed to illustrate the encoding technique of the present invention. Both are 8/9 rate (0,4) codes meaning that each eight source bits are encoded into nine channel bits such that no more than four consecutive "0"s occur in the encoded data. There is no k1 constraint, that is, there is no constraint on the maximum number of consecutive "0"s in either interleave.

The two example codes are not meant to limit the invention. Codes having rates other than 8/9 and constraints other than (0,4) could be used without departing from the scope and spirit of the invention.

DETAILED DESCRIPTION OF THE PRESENT INVENTION

Partial Response class-IV magnetic recording channels are characterized by a 1-$D^2$ polynomial which exhibits spectral nulls at dc and at the Nyquist frequency. The output of the channel is thus a function of the current input and the input at n-2:

$$y(n)=x(n)-x(n-2).$$

With the binary input data modulating the write current such that a "1" bit generates current in a positive direction (+1) and a "0" bit in the negative direction (−1), the output samples of the channel y(n) take on the values 2,0,−2, hereinafter normalized to 1,0,−1.

Figure 1:
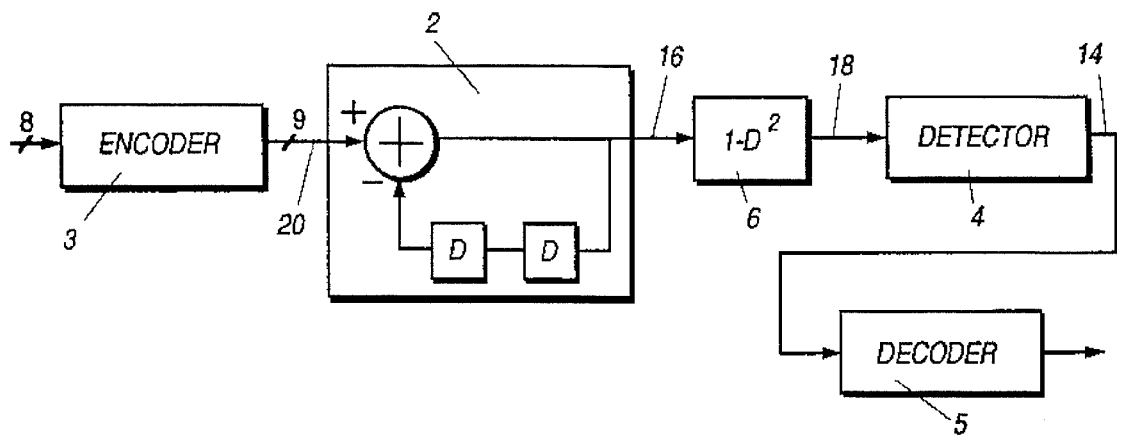
FIG. 1 is a block diagram of the recording system including an encoder, a pre-coder, a 1-$D^2$ Partial Response Class-IV channel, a Viterbi detector and a decoder.

Referring now to FIG. 1, the 8-bit data words are encoded into 9-bit code words using the encoder 3 of the present invention. In order to prevent error propogation and to retain the global k constraint for timing and gain control, the output of the encoder 20 is pre-coded by a 1/1-$D^2$ polynomial 2 before writing the codewords to the channel 6. This pre-coding is taken into account in the Viterbi detector 4 when the sampled data is read from the recording channel 6. The detector 4 detects the digital sequence or the codewords, and the codewords are decoded 5 back into 8-bit data words.

Figure 2:
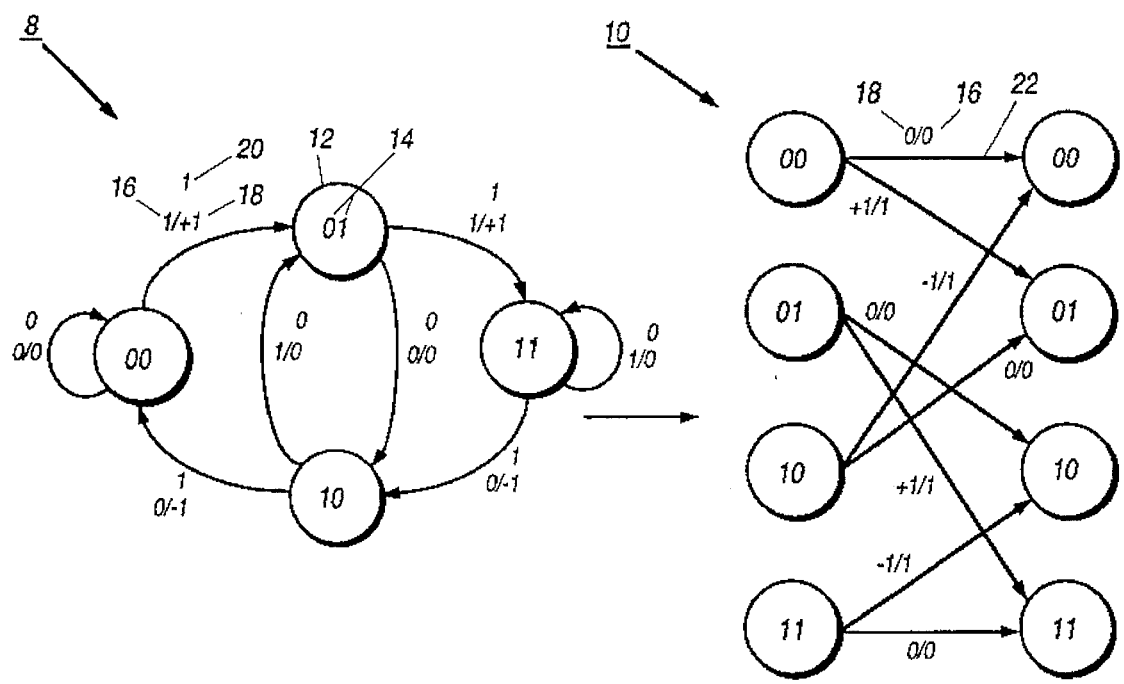
FIG. 2 shows a state diagram for a 1-$D^2$ Partial Response Class-IV channel and the corresponding survivor sequence extension from each state for the trellis diagram.

The binary input 16 to the channel 6 and normalized output 18 can be depicted by a state diagram 8 as shown in FIG. 2. In the diagram a state 12 represents the previous two output bits 16 from the pre-coder 2. A transition is depicted by the current encoder output 20 and the corresponding pre-coder output 16 and channel output 18.

The operation of the Viterbi sequence detector can be further understood from a trellis diagram. As shown in FIG. 2, each state of the state diagram 8 corresponds to a state in the trellis diagram 10. Each path 22 from one state to the next represents one bit 16 of a survivor sequence for a detected codeword given the current sample value 18 read from the 1-$D^2$ channel 6. A survivor sequence is a possible correct recorded sequence given several samples read from the channel.

For example, a non-zero sample read from the channel is caused either by a "1" in the recorded sequence or a "0" in the recorded sequence and noise in the channel. Thus two survivor sequences are saved, one with a "1" and the other with a "0". The correct sequence is determined from future samples read from the channel; that is, the correct sequence is determined by choosing the sequence with the maximum likelihood of being correct given future samples read from the channel. The maximum likelihood sequence is the sequence that minimizes the mean squared error between the sample value read from the channel and the sample value expected. For instance, if a sample value read from the channel is +0.8, then the squared sample error value for a "0" in the sequence is $(0-(+0.8))^2$, and the squared sample error value for a "1" in the sequence is $(+1-(+0.8))^2$.

A sum of the mean squared errors is stored for each survivor sequence, and the sequence with the least mean squared error has the highest probability of being correct. After a "1" in each interleave of the recorded sequence has been processed by the Viterbi detector, there will be only one survivor sequence with a minimum mean squared error up to the first "1", and the paths storing the other survivor sequences will have merged into this maximum likelihood path.

At any given time there can be up to four survivor sequences; accordingly, there are four path memories in the Viterbi detector. To aid in understanding the invention, each of the four path memories is represented by a corresponding state in the trellis diagram.

Figure 3:
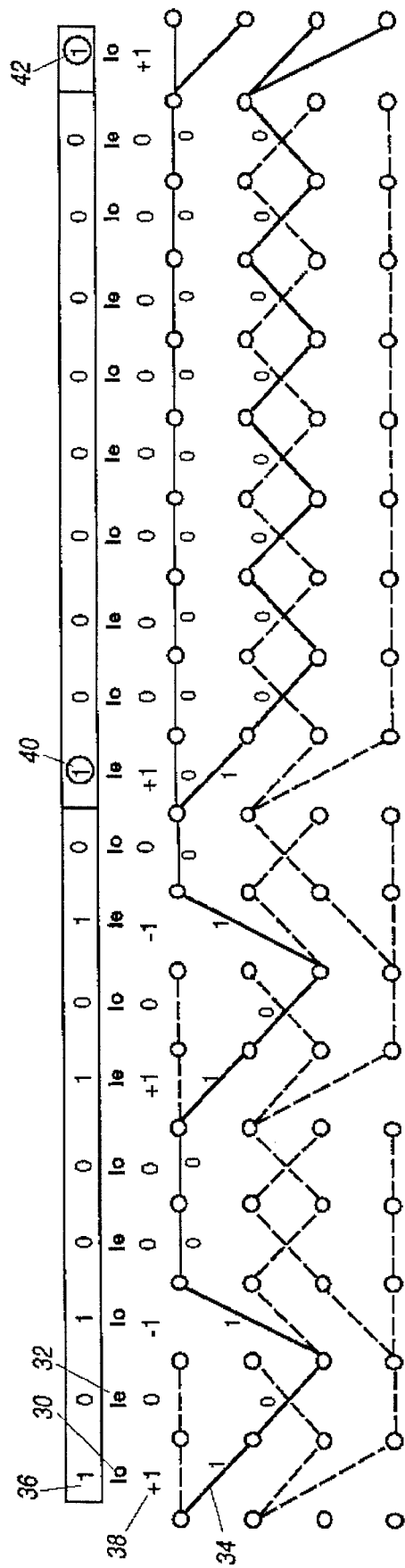
FIG. 3 is an example trellis diagram for a 1-$D^2$ Partial Response Class-IV channel as related to the prior art k1 constraint.

Referring now to FIG. 3, shown is a trellis diagram for a particular recorded sequence 36 (i.e., an encoded sequence) and corresponding sample sequence 38 read from the 1-$D^2$ channel 6. The sequence is labeled as odd 30 and even 32 interleaves, and each interleave has a constraint of k1=4; that is, the encoding scheme uses the prior art technique. As shown in the diagram, the path memories do not merge into a single survivor sequence 34 until a "1" bit 40 in the even interleave and a "1" bit 42 in the odd interleave have been detected. Therefore, the length of the path memories must be at least 2(k1+1)+1 or 2(4+1)+1=11 bits long, and the next bit in the correct sequence is not available until 11 samples have been read from the channel. Before a complete codeword is available, there is a latency of 2(k1+1)+1+n, where n is the number of bits in a codeword (e.g., 9 in a 8/9 code). This latency is undesirable as previously described. Further, if the "1" bit 42 in the odd interleave is erased, the path memories will not have merged after 2(k1+1) bits and the survivor sequence selected for the codeword may not be correct.

ENCODER

Figure 4:
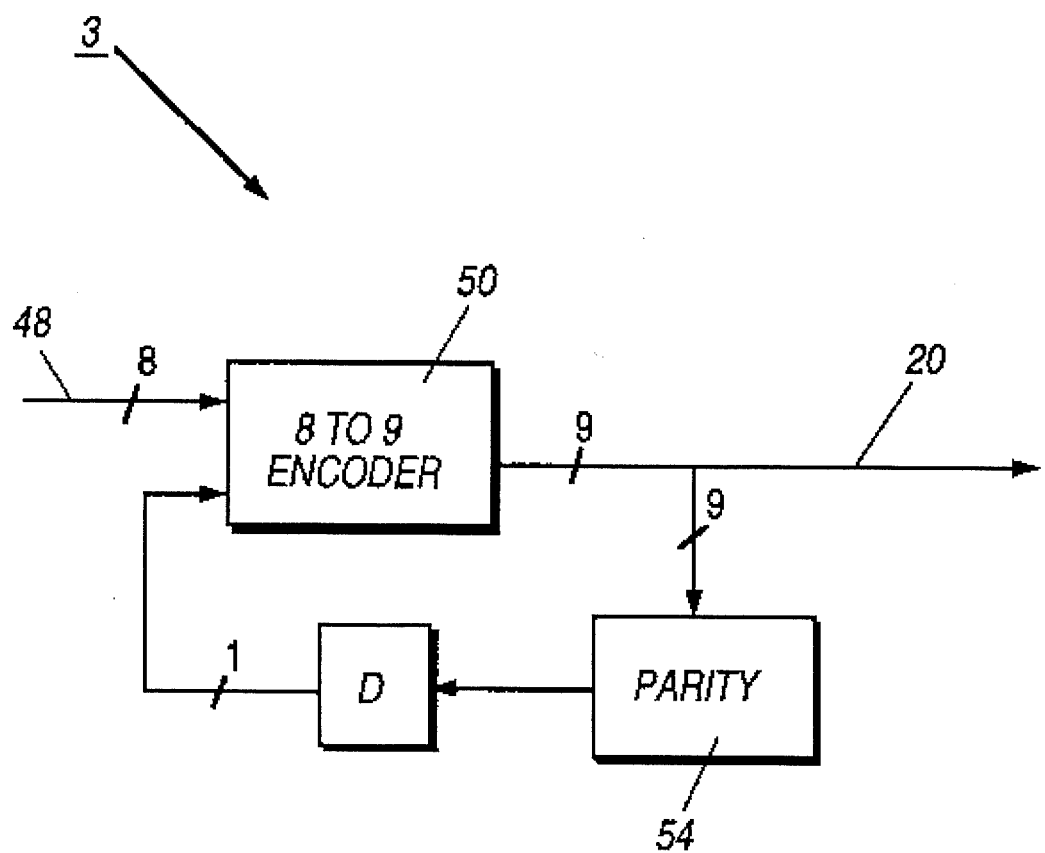
FIG. 4 is a block diagram of the encoder of the present invention.

A block diagram of the encoder 3 of the present invention is shown in FIG. 4. Eight bits 48 of source data are encoded 50 into nine bit codewords 20 using the parity 54 (modulo-2 sum) of the previous codeword. The encoding scheme is unique to the present invention and is hereinafter described.

Figure 5A:
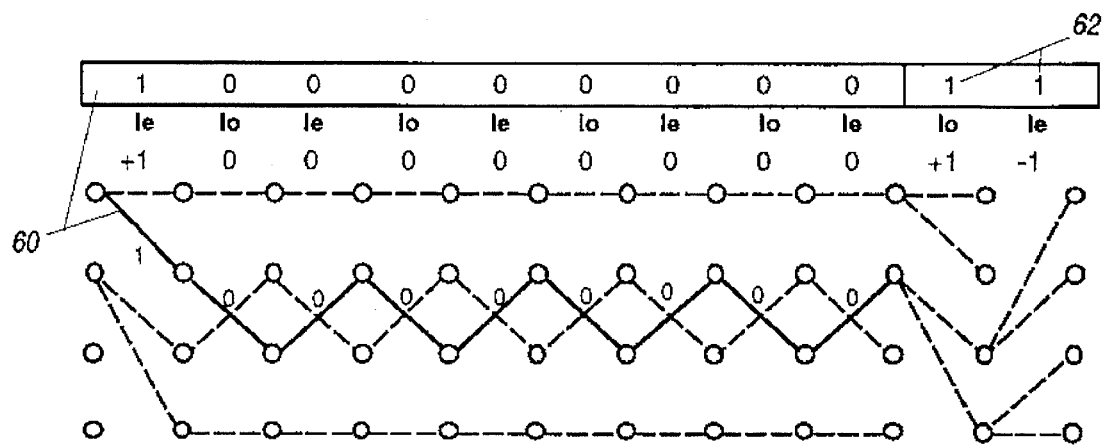
FIG. 5a, 5b, and 5c show example trellis diagrams for a 1-$D^2$ Partial Response Class-IV channel storing a first and second codeword of the present invention.
Figure 5B:
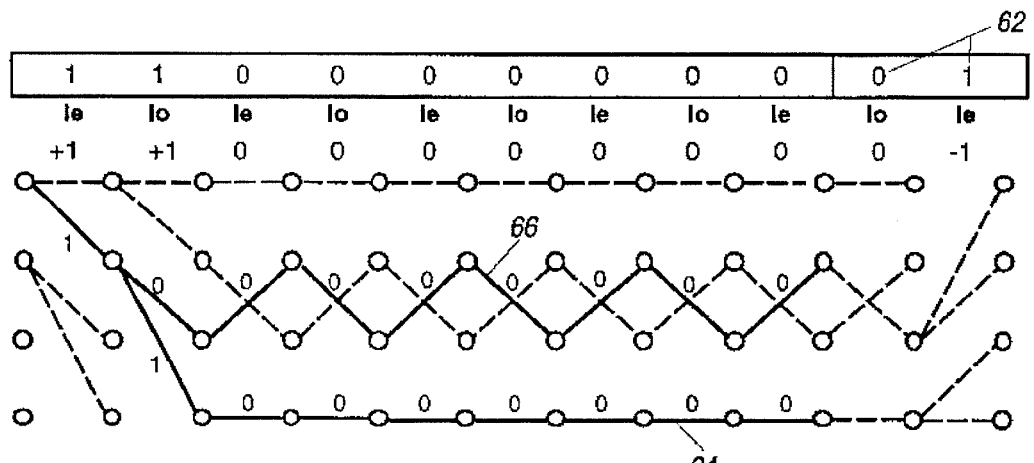
Figure 5C:
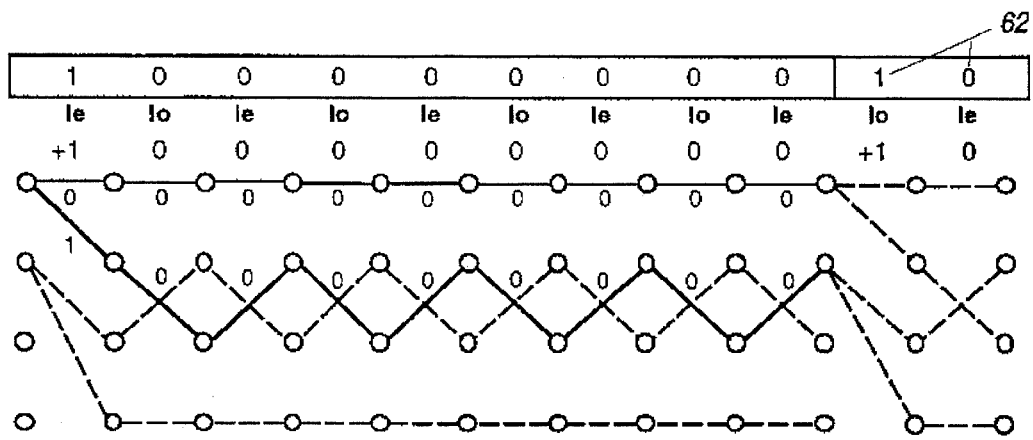

The minimum latency encoding scheme of the present invention, which has the k constraint but not the k1 constraint, can be understood from the trellis diagrams shown in FIGS. 5a, 5b and 5c. In these figures, an 8/9 code is implemented and the trellis diagram stores 9 bits 60 of a first codeword and 2 bits 62 from a second codeword that follows the first.

As shown in FIG. 5a, if the 2 bits 62 from the second codeword are {1,1}, then the path memories storing the first codeword will have merged into a single survivor sequence 60 because there is a "1" bit in both the even and odd interleave. That is, the parity of the first codeword is not necessary to select the correct path memory because all the path memories are the same. If the 2 bits 62 from the second codeword are {0,1} or {1,0}, then the path memories will store two survivor sequences different by only one bit.

For instance, FIG. 5b shows the case where the 2 bits 62 from the second codeword are {0,1} wherein the two resulting survivor sequences for the first codeword are {1,1,0,0,0,0,0,0,0} 64 and {1,0,0,0,0,0,0,0,0} 66. Since the two sequence are different in only one bit, the correct sequence can be selected using the parity of the first codeword. Thus if the parity is even, the first survivor sequence 64 is selected, and if the parity is odd, the second survivor sequence 66 is selected. FIG. 5c shows the same result for the case where the 2 bits 62 from the second codeword are {1,0}. The parity of the first codeword is determined during the encoding process.

If the second data word encodes into a codeword out of a first group of codewords wherein the first two bits are {1,1}, then the parity of the first codeword is ignored since the path memories will have merged into one survivor sequence. If the second data word does not encode into the {1,1} group, then it is encoded into either the {0,1} or {1,0} group of codewords depending on the parity of the first codeword. For instance, if the first codeword has even parity, then the second codeword is selected from the {0,1} group of codewords, and if the first codeword has odd parity, then the second codeword is selected from the {1,0} group. When the data is detected by the Viterbi detector, the path memory storing the first codeword is selected based on its corresponding parity as determined by the second codeword.

To this point, the invention has been described with respect to a $1-D^2$ four state Viterbi detector. However, the $1-D^2$ channel can be factored into a pair of interleaved 1-D channels and detected using a pair of two state Viterbi detectors. See Roy D. Cideciyan, Francois Dolivo, Walter Hirt, and Wolfgang Schott, "A PRML System for Digital Magnetic Recording", IEEE Journal on Selected Areas in Communications, Vol. 10 No. 1, January 1992, pp.38–56. Using two interleaved sequence detectors simplifies the detection algorithm, and the encoding technique of the present invention is applicable to this interleaved detection scheme.

Figure 6A:
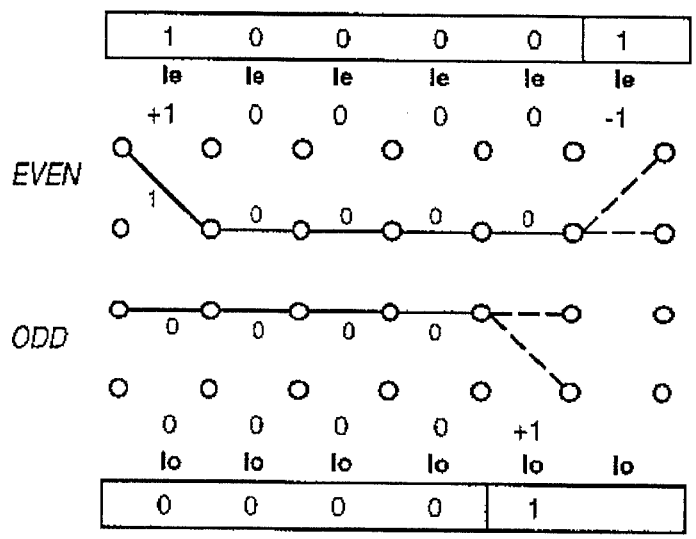
FIG. 6a, 6b, and 6c show example trellis diagrams for a pair of 1-D channels processing the even and odd interleaves of the 1-$D^2$ Partial Response Class-IV channel storing a first and second codeword of the present invention.
Figure 6B:
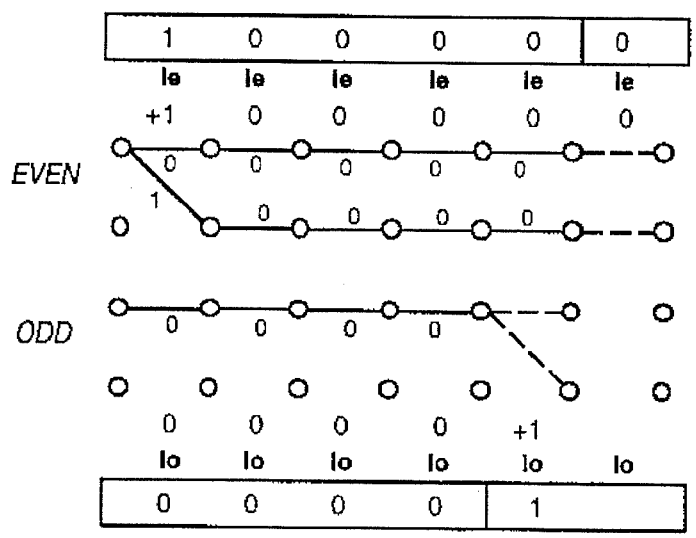
Figure 6C:
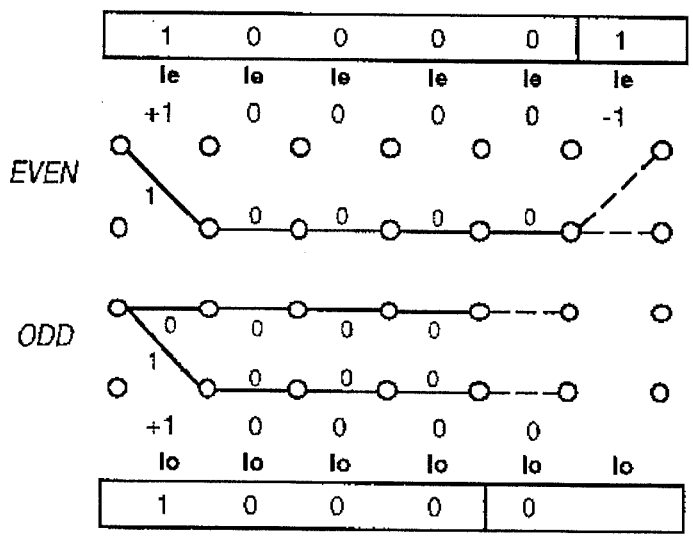

FIGS. 6a, 6b, and 6c show the two state trellis diagrams for the interleaved detectors corresponding to the four state trellis diagrams in FIGS. 5a, 5b, and 5c, respectively. In FIG. 6a there is a "1" in both interleaves within the first two bits of the second codeword; the path memories for both the even and odd interleave have merged into the correct sequence for the first codeword. In FIG. 6b there is a "1" only in the odd interleave within the first two bits of the second codeword; the even interleave has not merged and contains two survivor sequences. FIG. 6c shows a similar situation where the odd interleave has not merged into a single survivor sequence.

As in the four state detector described above, the correct survivor sequence for the first codeword is selected based on its parity as determined by the second codeword. The even interleave will not have merged only when followed by a codeword from the {1,0} group; the path memory of the even interleave is selected such that the parity of the first codeword is odd since codewords that precede the {1,0} codewords always have odd parity. Similarly, the odd interleave will not have merged only when preceded by a codeword from the {0,1} group; the path memory of the odd interleave is selected such that the parity of the first codeword is even since codewords that precede the {0,1} codewords always have even parity.

For the 8/9 code having a {0,4} constraint there are not enough 9 bit codewords in the groups of {1,1,X,X,X,X,X,X,X}, {0,1,X,X,X,X,X,X,X}, and {1,0,X,X,X,X,X,X,X} to encode 256 data words; a third bit must be used. The resulting groups of codewords and corresponding parity of the previous codeword are shown in Table 1.

TABLE 1

| GROUP1: | {0,0,1,X,X,X,X,X} | odd parity |
| GROUP2: | {0,1,0,X,X,X,X,X} | odd parity |
| GROUP3: | {0,1,1,X,X,X,X,X} | don't care |
| GROUP4: | {1,0,0,X,X,X,X,X} | even parity |
| GROUP5: | {1,0,1,X,X,X,X,X} | even parity |
| GROUP6: | {1,1,0,X,X,X,X,X} | don't care |
| GROUP7: | {1,1,1,X,X,X,X,X} | don't care |

Groups 3, 5, 6 and 7 have a "1" bit in both the even and odd interleave within the first 3 bits and thus perform the same function as the {1,1} group described above. The remaining groups are divided into those that follow codewords with even and odd parity as follows: groups 1 and 2 always follow codewords with odd parity, and groups 4 and 5 always follow codewords with even parity. The mapping of data words codewords is arbitrary, and the assignment of even and odd parity may also be reversed.

An example mapping in octal notation of data words to codewords is shown in Table 2 and Table 3. Table 2 shows the mapping of data words into codewords out of groups 3, 5, 6 and 7. Table 3 shows the mapping of data words into codewords out of groups 1 and 2 if the parity of the previous codeword is odd, and into codewords out of groups 4 and 5 if the parity of the previous codeword is even.

TABLE 2

| Data | CW | Data | CW | Data | CW | Data | CW |
| --- | --- | --- | --- | --- | --- | --- | --- |
| 000 | 362 | 050 | 321 | 130 | 605 | 220 | 704 |
| 001 | 342 | 051 | 323 | 131 | 607 | 221 | 706 |
| 002 | 312 | 052 | 331 | 132 | 615 | 222 | 714 |
| 003 | 352 | 053 | 333 | 133 | 617 | 223 | 716 |
| 004 | 662 | 054 | 361 | 134 | 645 | 224 | 744 |
| 005 | 642 | 055 | 363 | 135 | 647 | 225 | 746 |
| 006 | 612 | 056 | 371 | 136 | 655 | 226 | 754 |
| 007 | 652 | 057 | 373 | 137 | 657 | 227 | 756 |
| 010 | 332 | 060 | 324 | 150 | 621 | 230 | 705 |
| 011 | 322 | 061 | 326 | 151 | 623 | 231 | 707 |
| 012 | 311 | 062 | 334 | 152 | 631 | 232 | 715 |
| 013 | 313 | 063 | 336 | 153 | 633 | 233 | 717 |
| 014 | 341 | 064 | 364 | 154 | 661 | 234 | 745 |
| 015 | 343 | 065 | 366 | 155 | 663 | 235 | 747 |
| 016 | 351 | 066 | 374 | 156 | 671 | 236 | 755 |
| 017 | 353 | 067 | 376 | 157 | 673 | 237 | 757 |
| 020 | 304 | 070 | 325 | 160 | 624 | 250 | 721 |
| 021 | 306 | 071 | 327 | 161 | 626 | 251 | 723 |
| 022 | 314 | 072 | 335 | 162 | 634 | 252 | 731 |
| 023 | 316 | 073 | 337 | 163 | 636 | 253 | 733 |
| 024 | 344 | 074 | 365 | 164 | 664 | 254 | 761 |
| 025 | 346 | 075 | 367 | 165 | 666 | 255 | 763 |
| 026 | 354 | 076 | 375 | 166 | 674 | 256 | 771 |
| 027 | 356 | 077 | 377 | 167 | 676 | 257 | 773 |
| 030 | 305 | 110 | 632 | 170 | 625 | 260 | 724 |
| 031 | 307 | 111 | 622 | 171 | 627 | 261 | 726 |
| 032 | 315 | 112 | 611 | 172 | 635 | 262 | 734 |
| 033 | 317 | 113 | 613 | 173 | 637 | 263 | 736 |
| 034 | 345 | 114 | 641 | 174 | 665 | 264 | 764 |
| 035 | 347 | 115 | 643 | 175 | 667 | 265 | 766 |
| 036 | 355 | 116 | 651 | 176 | 675 | 266 | 774 |
| 037 | 357 | 117 | 653 | 177 | 677 | 267 | 776 |
| 040 | 703 | 120 | 604 | 210 | 732 | 270 | 725 |
| 041 | 742 | 121 | 606 | 211 | 722 | 271 | 727 |
| 042 | 712 | 122 | 614 | 212 | 711 | 272 | 735 |
| 043 | 752 | 123 | 616 | 213 | 713 | 273 | 737 |
| 044 | 762 | 124 | 644 | 214 | 741 | 274 | 765 |
| 045 | 372 | 125 | 646 | 215 | 743 | 275 | 767 |
| 046 | 672 | 126 | 654 | 216 | 751 | 276 | 775 |
| 047 | 772 | 127 | 656 | 217 | 753 | 277 | 777 |

TABLE 3

| Data | CW even parity | CW odd parity | Data | CW even parity | CW odd parity |
| --- | --- | --- | --- | --- | --- |
| 100 | 542 | 142 | 320 | 562 | 162 |
| 101 | 503 | 103 | 321 | 526 | 126 |
| 102 | 511 | 111 | 322 | 534 | 134 |
| 103 | 513 | 113 | 323 | 536 | 136 |
| 104 | 541 | 141 | 324 | 564 | 164 |
| 105 | 543 | 143 | 325 | 566 | 166 |
| 106 | 551 | 151 | 326 | 574 | 174 |
| 107 | 553 | 153 | 327 | 576 | 176 |
| 140 | 532 | 132 | 330 | 525 | 172 |
| 141 | 523 | 123 | 331 | 527 | 127 |
| 142 | 531 | 131 | 332 | 535 | 135 |

TABLE 3-continued

| Data | CW even parity | CW odd parity | Data | CW even parity | CW odd parity |
|---|---|---|---|---|---|
| 143 | 533 | 133 | 333 | 537 | 137 |
| 144 | 561 | 161 | 334 | 565 | 165 |
| 145 | 563 | 163 | 335 | 567 | 167 |
| 146 | 571 | 171 | 336 | 575 | 175 |
| 147 | 573 | 173 | 337 | 577 | 177 |
| 200 | 412 | 232 | 340 | 572 | 272 |
| 201 | 442 | 222 | 341 | 422 | 262 |
| 202 | 411 | 211 | 342 | 414 | 214 |
| 203 | 413 | 213 | 343 | 416 | 216 |
| 204 | 441 | 252 | 344 | 444 | 244 |
| 205 | 443 | 243 | 345 | 446 | 246 |
| 206 | 451 | 251 | 346 | 454 | 254 |
| 207 | 453 | 253 | 347 | 456 | 256 |
| 240 | 432 | 221 | 350 | 452 | 205 |
| 241 | 423 | 223 | 351 | 512 | 207 |
| 242 | 431 | 231 | 352 | 415 | 215 |
| 243 | 433 | 233 | 353 | 417 | 217 |
| 244 | 461 | 261 | 354 | 445 | 245 |
| 245 | 463 | 263 | 355 | 447 | 247 |
| 246 | 471 | 271 | 356 | 455 | 255 |
| 247 | 473 | 273 | 357 | 457 | 257 |
| 300 | 552 | 152 | 360 | 462 | 224 |
| 301 | 506 | 106 | 361 | 426 | 226 |
| 302 | 514 | 114 | 362 | 434 | 234 |
| 303 | 516 | 116 | 363 | 436 | 236 |
| 304 | 544 | 144 | 364 | 464 | 264 |
| 305 | 546 | 146 | 365 | 466 | 266 |
| 306 | 554 | 154 | 366 | 474 | 274 |
| 307 | 556 | 156 | 367 | 476 | 276 |
| 310 | 522 | 122 | 370 | 472 | 225 |
| 311 | 507 | 107 | 371 | 427 | 227 |
| 312 | 515 | 115 | 372 | 435 | 235 |
| 313 | 517 | 117 | 373 | 437 | 237 |
| 314 | 545 | 145 | 374 | 465 | 265 |
| 315 | 547 | 147 | 375 | 467 | 267 |
| 316 | 555 | 155 | 376 | 475 | 275 |
| 317 | 557 | 157 | 377 | 477 | 277 |

The encoder 3 can be implemented with either combinatorial logic or sequential logic or can be implemented as a look-up table, e.g a ROM. A person skilled in the art could also implement the encoding scheme in software without departing from the scope and spirit of the invention. In the preferred embodiment the encoder is implemented with combinatorial logic and the logic equations are listed in Table 4 where "abcdefgh" is the input byte, p is the parity of the previous codeword, and "ABCDEFGHJ" is the output codeword. An exclamation "!" indicates an inverted term. "A" and "a" are the most significant bits of the input byte and output codeword, respectively.

TABLE 4

A =   !a !b !d !c f g + !a !b !d !e f !h +a !p +
      b !p + !a !b c !d !c !f + !a !b !c !d !e f +
      a !b d + !a b d + a !b e + !a b e.
B =   a c p + !b p + !a d + !a e + !a !b + !b d + !b e.
C =   !a !b c !g + !a !b c h + a b !c + !a !b !f +
      !a b !d !c + a !d e !f !g h !p + b !d !c !f !g !h !p +
      !b d + !b c.
D =   a b !c !e !g !h + !a !c !d !e !g !h + a b c !g !h !p +
      a b !c d !g !h p + !b !c !d !e !g h !p + a b c !d !c !g p +
      !a !b !d !c h + a f + b f + e f +d f +c f.
E =   !c !d e !f !g !h + !a !b !c !d !e !g !h + b c !e !f !g +
      !b c e + !b c f + a !b !d !f !g p + a b d + !a b c + a !b c +
      !a !d c !f !g + !b !d e !f !g + c d.
F =   a !c !d !e !f !h + !b !c !d e !f !h + a b !c d e !f !h p +
      a !b !c !d !c !h p + a b c e !f !h !p + b c !d !e !f !h +
      a !d e !f !h !p + a b c !d e !f !p +
      !a !b c !d !c f h + !a !c !d e !f !h +g.
G =   a b c e p + a b !c h + a b f + a b g + !b d + c d p +
      !c d e !p + d h + !a d.
H =   a b !e !f !g !p + a b c !f !g !p + a b !c !f !g p +
      !b !c !d !e !g p + b !d !e !f !g + !d !e !f !g !p +
      !c !d !f !g + h + !a !b !d !e.
J =   a !b c !d p + !a b !d !e h + a !b !d f !p + a·!b c !d h +
      a !b !d g + !a b !d f + !a b !d g + a !b !d f h +
      !c d e !p + d e h + c e p + e f + e g + a b !c e h +
      !a !b c !d !f !g !h + !b d e + !a d e + !a c e + !b c e.

Figure 7A:
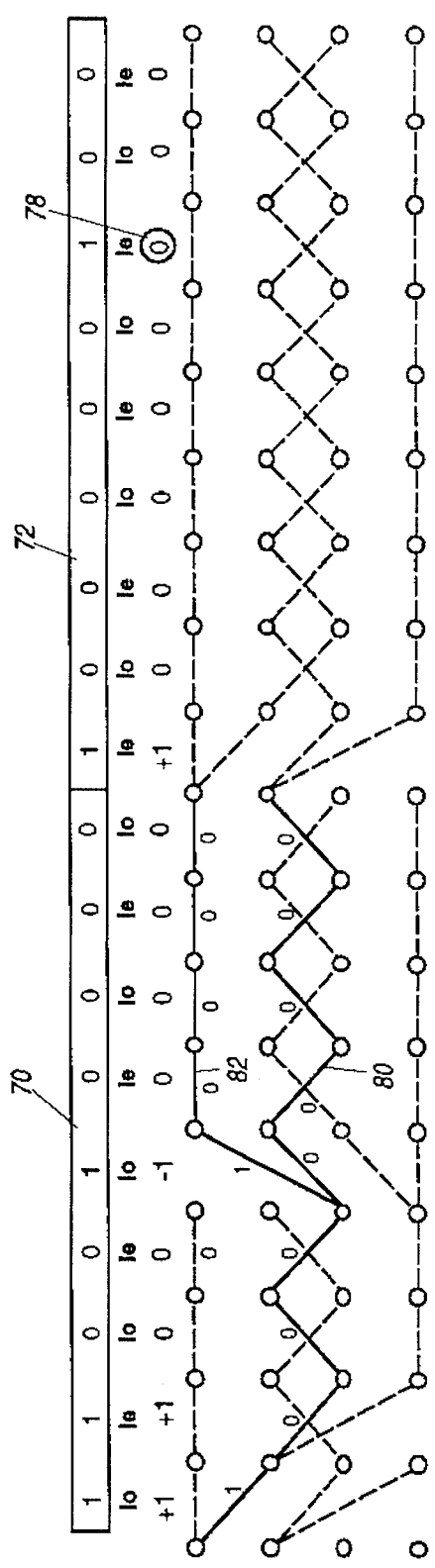
FIG. 7a and 7b show example trellis diagrams for a 1-$D^2$ Partial Response Class-IV channel storing a first and second codeword of the present invention where a "1" bit has been erased from the second codeword due to noise.
Figure 7B:
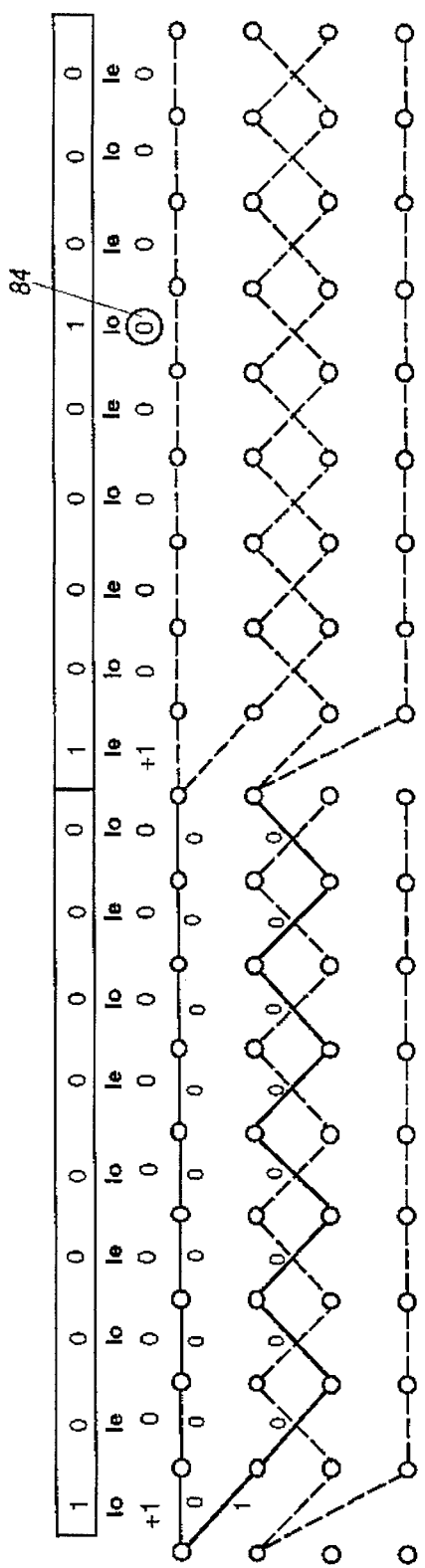

The error correcting encoding technique of the present invention, which has the k constraint but not the k1 constraint, can be understood from the trellis diagrams shown in FIGS. 7a and 7b. In these figures, an 8/9 code is implemented and the trellis diagram stores 9 bits 70 of a first codeword and 9 bits 72 from a second codeword that follows the first. If the 9 bits 72 from the second codeword has at least one "1" bit in one interleave and only one "1" bit in the other interleave and that "1" bit in the other interleave is erased due to noise, then the path memories will store two survivor sequences different by only one bit.

For instance, FIG. 7a shows the case wherein a "1" bit 78 in the odd interleave of the second codeword has been erased due to noise. The two resulting survivor sequences for the first codeword are {1,0,0,0,0,0,0,0,0} 80 and {1,0,0,0,1,0,0,0,0} 82. Since the two sequence are different in only one bit, the correct sequence can be selected using the parity of the first codeword. Thus if the parity is odd, the first survivor sequence 80 is selected., and if the parity is even, the second survivor sequence 82 is selected, FIG. 7b shows the same result for the case wherein a "1" bit 84 in the even interleave of the second codeword has been erased due to noise. As in the minimum latency encoding scheme, the parity of the first codeword is determined during the encoding process.

An example mapping in octal notation of data words to codewords is shown in Table 5 and Table 6. Table 5 shows the mapping of data words into codewords out of all groups 1, 2, 3, 4, 5, 6 and 7 which have at least two "1" bits in both the even and odd interleaves. Table 6 shows the mapping of data words into codewords out of groups 1 and 2 if the parity of the previous codeword is odd, and into codewords out of groups 4 and 5 if the parity of the previous codeword is even. The codewords in Table 6 have zero or one "1" bit in one interleave and at least one "1" bits in the other interleave.

TABLE 5

| Data | CW | Data | CW | Data | CW | Data | CW |
|---|---|---|---|---|---|---|---|
| 000 | 416 | 075 | 263 | 176 | 375 | 277 | 677 |
| 001 | 446 | 076 | 275 | 177 | 377 | 300 | 137 |
| 002 | 454 | 077 | 277 | 200 | 413 | 301 | 167 |
| 003 | 456 | 100 | 433 | 201 | 443 | 302 | 175 |
| 004 | 436 | 101 | 463 | 202 | 451 | 303 | 177 |
| 005 | 466 | 102 | 471 | 203 | 453 | 304 | 537 |
| 006 | 474 | 103 | 473 | 204 | 417 | 305 | 567 |
| 007 | 476 | 104 | 437 | 205 | 447 | 306 | 575 |
| 010 | 113 | 105 | 467 | 206 | 455 | 307 | 577 |
| 011 | 143 | 106 | 475 | 207 | 457 | 311 | 703 |
| 012 | 151 | 107 | 477 | 211 | 263 | 312 | 711 |
| 013 | 153 | 111 | 303 | 212 | 611 | 313 | 713 |
| 014 | 513 | 112 | 311 | 213 | 613 | 314 | 741 |
| 015 | 543 | 113 | 313 | 214 | 641 | 315 | 743 |
| 016 | 551 | 114 | 341 | 215 | 643 | 316 | 751 |
| 017 | 553 | 115 | 343 | 216 | 651 | 317 | 753 |
| 020 | 116 | 116 | 351 | 217 | 653 | 321 | 706 |
| 021 | 146 | 117 | 353 | 221 | 606 | 322 | 714 |
| 022 | 154 | 121 | 306 | 222 | 614 | 323 | 716 |
| 023 | 156 | 122 | 314 | 223 | 616 | 324 | 744 |
| 024 | 516 | 123 | 316 | 224 | 644 | 325 | 746 |
| 025 | 546 | 124 | 344 | 225 | 646 | 326 | 754 |
| 026 | 554 | 125 | 346 | 226 | 654 | 327 | 756 |
| 027 | 556 | 126 | 354 | 227 | 656 | 331 | 707 |

TABLE 5-continued

| Data | CW | Data | CW | Data | CW | Data | CW |
|---|---|---|---|---|---|---|---|
| 030 | 117 | 127 | 356 | 231 | 607 | 332 | 715 |
| 031 | 147 | 131 | 307 | 232 | 615 | 333 | 717 |
| 032 | 155 | 132 | 315 | 233 | 617 | 334 | 745 |
| 033 | 157 | 133 | 317 | 234 | 645 | 335 | 747 |
| 034 | 517 | 134 | 345 | 235 | 647 | 336 | 755 |
| 035 | 547 | 135 | 347 | 236 | 655 | 337 | 757 |
| 036 | 555 | 136 | 355 | 237 | 657 | 340 | 273 |
| 037 | 557 | 137 | 357 | 240 | 233 | 341 | 532 |
| 040 | 136 | 140 | 271 | 241 | 432 | 342 | 562 |
| 041 | 166 | 141 | 132 | 242 | 462 | 343 | 572 |
| 042 | 174 | 142 | 162 | 243 | 472 | 344 | 722 |
| 043 | 176 | 143 | 172 | 244 | 622 | 345 | 732 |
| 044 | 536 | 144 | 322 | 245 | 632 | 346 | 762 |
| 045 | 566 | 145 | 332 | 246 | 662 | 347 | 772 |
| 046 | 574 | 146 | 362 | 247 | 672 | 351 | 723 |
| 047 | 576 | 147 | 372 | 251 | 623 | 352 | 731 |
| 050 | 133 | 151 | 323 | 252 | 631 | 353 | 733 |
| 051 | 163 | 152 | 331 | 253 | 633 | 354 | 761 |
| 052 | 171 | 153 | 333 | 254 | 661 | 355 | 763 |
| 053 | 173 | 154 | 361 | 255 | 663 | 356 | 771 |
| 054 | 533 | 155 | 363 | 256 | 671 | 357 | 773 |
| 055 | 563 | 156 | 371 | 257 | 673 | 361 | 726 |
| 056 | 571 | 157 | 373 | 261 | 626 | 362 | 734 |
| 057 | 573 | 161 | 326 | 262 | 634 | 363 | 736 |
| 061 | 226 | 162 | 334 | 263 | 636 | 364 | 764 |
| 062 | 234 | 163 | 336 | 264 | 664 | 365 | 766 |
| 063 | 236 | 164 | 364 | 265 | 666 | 366 | 774 |
| 064 | 264 | 165 | 366 | 266 | 674 | 367 | 776 |
| 065 | 266 | 166 | 374 | 267 | 676 | 371 | 727 |
| 066 | 274 | 167 | 376 | 271 | 627 | 372 | 735 |
| 067 | 276 | 171 | 327 | 272 | 635 | 373 | 737 |
| 071 | 227 | 172 | 335 | 273 | 637 | 374 | 765 |
| 072 | 235 | 173 | 337 | 274 | 665 | 375 | 767 |
| 073 | 237 | 174 | 365 | 275 | 667 | 376 | 775 |
| 074 | 265 | 175 | 367 | 276 | 675 | 377 | 777 |

TABLE 6

| Data | CW even parity | CW odd parity | Data | CW even parity | CW odd parity |
|---|---|---|---|---|---|
| 060 | 464 | 252 | 230 | 415 | 231 |
| 070 | 465 | 225 | 250 | 431 | 229 |
| 110 | 541 | 261 | 260 | 434 | 262 |
| 120 | 544 | 144 | 270 | 435 | 223 |
| 130 | 545 | 145 | 310 | 511 | 222 |
| 150 | 561 | 161 | 320 | 514 | 114 |
| 160 | 564 | 164 | 330 | 515 | 115 |
| 170 | 565 | 165 | 350 | 531 | 131 |
| 210 | 525 | 232 | 360 | 534 | 134 |
| 220 | 461 | 272 | 370 | 535 | 135 |

Again, the encoder 3 can be implemented with either combinatorial logic or sequential logic or can be implemented as a look-up table, e.g. a ROM. A person skilled in the art could also implement the encoding scheme in software without departing from the scope and spirit of the invention. In the preferred embodiment the encoder is implemented with combinatorial logic and the logic equations are listed in Table 7 where "abcdefgh" is the input byte, p is the parity of the previous codeword, and "ABCDEFGHJ" is the output codeword. An exclamation "!" indicates an inverted term. "A" and "a" are the most significant bits of the input byte and output codeword, respectively.

TABLE 7

A = a d !p + b d !f !g !h !p + a e !h !p + b e !f !g !h !p + c d !f !g !h !p + !a !c !d !e + !b !d f + !b !c f + a c h + a d g + a e g + a d h + a c g + a b c h + a f + !b !c !d !e.

TABLE 7-continued

B = a !b e p + b !c !d e p + !b c d p + a !b d p + b c !d !e !g !h + b e g + b c h + a c !d !e !g !h + a e g + a e h + b e f + b d g + b d h + c d g + c d h + b c f + a e f + a d g + a d h + b d f + c d f + a c f + a d f.

C = b c f + b e f + !a !b !d e + b c g + b e g + b c h + b e h + !c !d e !f !g !h !p + b d + b c e + !a !b c !d + !a !c d + a b !c !e.

D = !b c d !e !g !h p + a d f + b e f + b d f + a !b !c d !e !g !h + !a !b d !g !h + !a b e !g !h + !a c d !g !h !p + b c !d !e !f !h + !b !c !d !g h + !c !d !e h + !d !e g + !a !b !d h + !a !b !c h + !a !b !d g + !a !b !c g + a e f + c d f.

E = a !b e !f !g !h p + a !b d !e !f !g !h + a !b !d e !f !g + b !d !f !g !h p + c e + c !p + b c + !a !d !e f + b !d !e + c g + c h + c f + c !d.

F = a !c d e !f !h + a b d !f !h + g h + a b c !f !g !h + a b !f !g !h !p + !d !e !f !g !h + a c !f !g !h !p + !a !b !e !f !h p + !b !c !f !h p + b c !d !e h + a c !d !e h + !a !b !d !h + !a !b !c !h + !c !d !e !h + d g + e g.

G = !a !c d + a !b !c e !f !g !h !p + b d + c d !p + !a d e + !a !b !d !e + !c !e f + a b !c !e + d g + d h + d f.

H = !d !e f !g + a !b c d !f !g p + a !c !d !f !g p + !b !e !f !g p + !a !b !c !g + a c !d !e + b c !d !e g + !a !b !d !g + !c !d !e !g + h.

J = b !d !c !f !g !h + e f + a c !d !f !g !h + e g + a !c !d !e + e h + b !c !d !e + e !p + a !b !c !f !g !h !p + d e + !a e.

DETECTOR/DECODER

In the preferred embodiment of the present invention, the detector 4 is a pair of two state Viterbi detectors as shown in FIG. 8. The only difference between the minimum latency version and the error correcting version is that the error correcting version stores nine bits of the second codeword rather than three. In both versions, the path memories storing the first three bits of the second codeword are used to determine which set the second codeword belongs, and thus determines the parity of the first codeword, As shown in Table 1, groups 1 and 2, which follow codewords with odd parity, have as the first three bits {0,0,1} and {0,1,0}, and groups 4 and 5, which follow codewords with even parity, have as the first three bits {1,0,0} and {1,0,1}. As shown in FIG. 5b and 5c, the survivor sequences stored in the path memories will be different by one bit in the odd interleave if the first two bits of the second codeword are {0,1} (as in group 2), and different by one bit in the even interleave if the first two bits of the second codeword are {1,0} or if the first three bits are {0,0,1} (as in groups 1, 4 and 5).

If the odd interleave is not merged, then the path memory is always chosen such that the parity of the first codeword is odd since the path memories storing the odd interleave will be different by one bit only when followed by a codeword from group 2. That is, the path memory storing four out of the nine bits of the first codeword is selected such that the parity of the first codeword is odd.

Since the path memories storing the even interleave (the five bits out of the nine bits) of the first codeword will be different by one bit when followed by codewords from groups 1, 4, and 5, the path memories storing the first bit of the second codeword are used to determine which group the second codeword belongs. If the path memories storing the first bit of the second codeword are "0", then the second codeword is from group 1 and the path memory storing the even interleave is selected such that the parity of the first codeword is odd. Otherwise, the second codeword is from group 4 or 5 and the path memory storing the even interleave is chosen such that the parity of the first codeword is even.

Figure 8A:
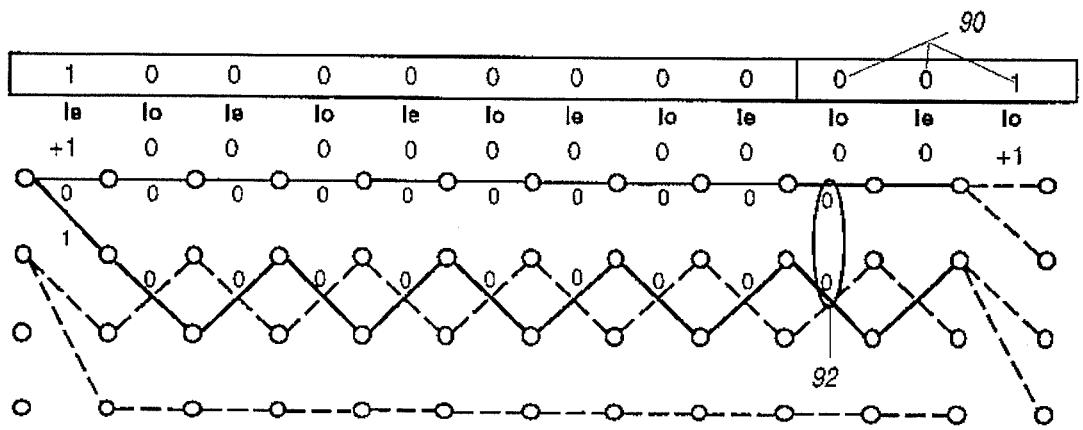
FIG. 8a, 8b and 8c show example trellis diagrams for a 1-$D^2$ Partial Response Class-IV channel storing a first and second codeword of the present invention where a look-ahead signal is generated from the path memories storing the first bit of the second codeword.
Figure 8B:
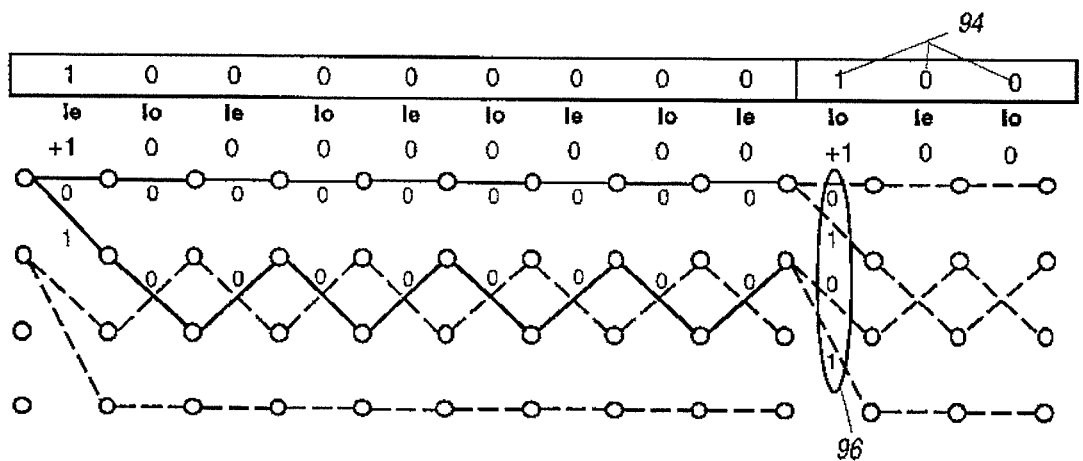
Figure 8C:
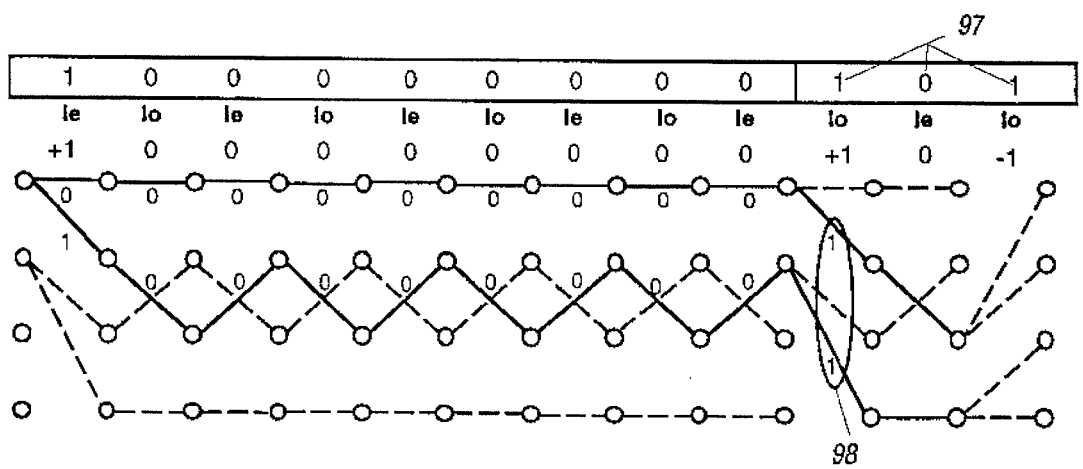

FIG. 8a, 8b and 8c show the cases where the second codeword is from group 1, group 4 and group 5 where the first three bits are {0, 0, 1} 90, {1, 0, 0} 94 and {1, 0, 1} 97 respectively. When the second codeword is from group 1, the path memories storing the first bit are all "0" 92. When the second codeword is from group 4, two of the path memories store a "0" bit and the other two a "1" bit 96. When the second codeword is from group 5, the path memories storing the first bit are all "1" 98.

Figure 12:
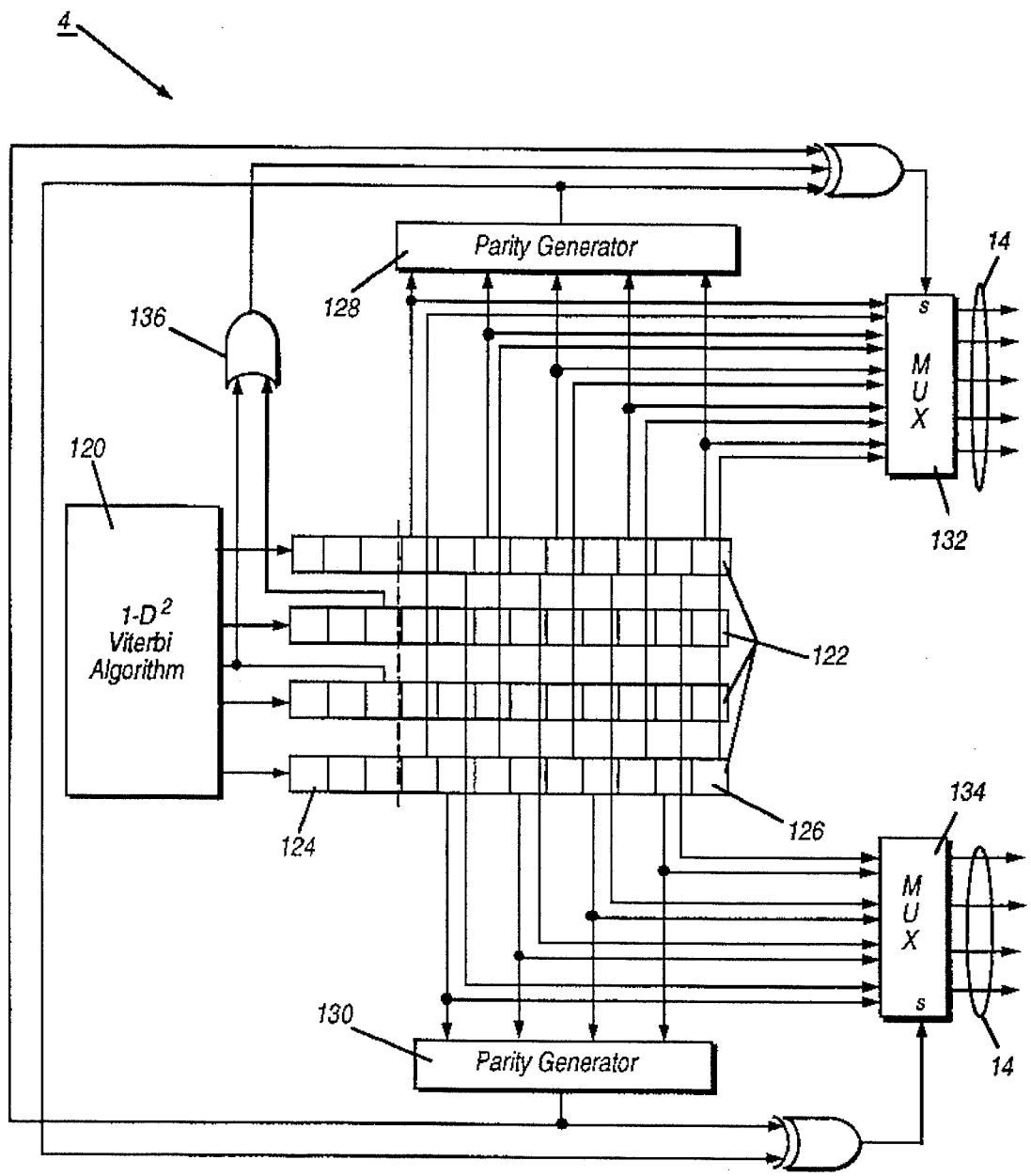
FIG. 12 shows a block diagram of the four state 1-$D^2$ Viterbi detector for an alternative embodiment of the present invention.

A look-ahead (herein after LA__IN) signal is generated as the OR 136 of the first bit of the second codeword from the two middle path memories for the four path Viterbi detector as shown in FIG. 12. For the paired dicode Viterbi detector, the LA__IN signal is generated from the OR 325 of the two path memories storing the odd interleave as shown in FIG. 9b. When the second codeword is from group 1, the LA__IN signal is inactive since the path memories are all "0", and when the second codeword is from either group 4 or group 5, the LA__IN signal is active. The LA__IN signal selects the correct survivor sequence for the even interleave of the first codeword according to its parity as determined by which group the second codeword is from.

MINIMUM LATENCY DETECTOR/DECODER

Figure 8D:
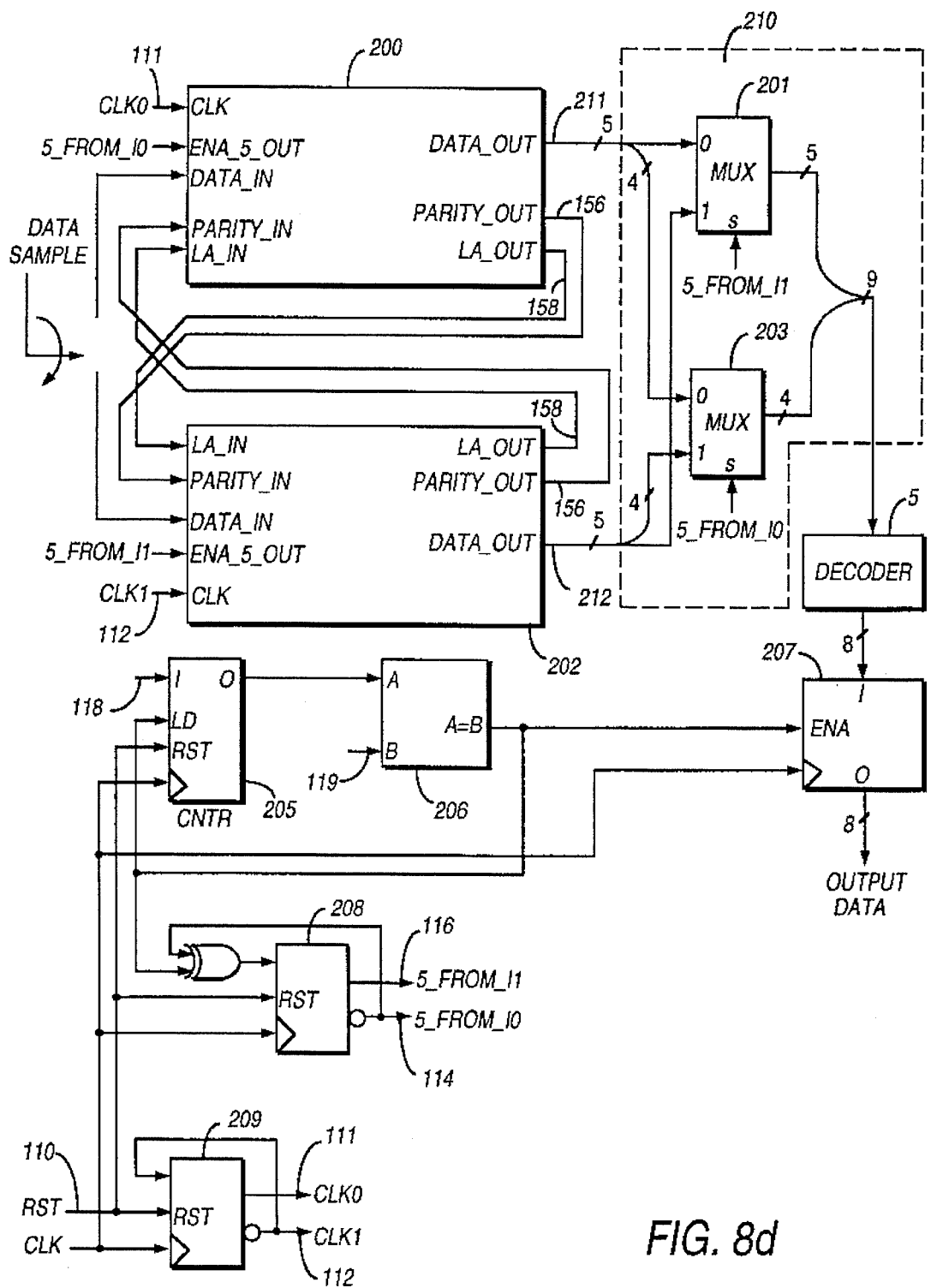
FIG. 8d is a block diagram of the detector/decoder of the present invention where the detector is implemented using a pair of two state 1-D sliding threshold Viterbi detectors.

Referring now to the preferred embodiment using a pair of dicode detectors as shown in FIG. 8d, before the detector processes any data samples the RST 110 signal clears counter 205 and flip-flops 208 and 209. Blocks 200 and 202 are sliding-threshold detectors which implement Viterbi detection for a 1-D channel. Block 200 receives the even numbered samples starting with sample 0. This sequence of samples will be referred to as interleave 0 or I0. Block receives the odd numbered samples starting with sample 1. This sequence of samples will be referred to as interleave 1 or I1. Flip-flop 209 produces two complementary clock signals at half the frequency of the sample clock. CLK0 111 drives the I0 detector and CLK1 112 drives the I1 detector. With each data sample, counter 205 increments by one. When twelve samples have been processed, the detectors have received the nine samples of the first codeword and three additional look-ahead samples.

At this point 5__FROM__I0 114 is "1" and so five bits from I0 and four bits from I1 are presented to decoder 5 via MUXes 201 and 203 and on the next clock the first output byte is latched into register 207. On that same clock edge, comparator 206, which compares the output of counter 205 to 12 applied at line 119, re-loads counter 285 with 4 over line 118. Flip-flop 208 is toggled which sets 5__FROM__I1 116 to "1". The next codeword then will be assembled by taking five bits from I1 202 and four bits from I0 200. Operation continues in this way with MUX 201 alternating between selecting detector I0 200 and selecting detector I1 202 to supply the five-bit interleave of a codeword while MUX 203 selects the other detector to supply the four-bit interleave of a codeword.

Figure 9A:
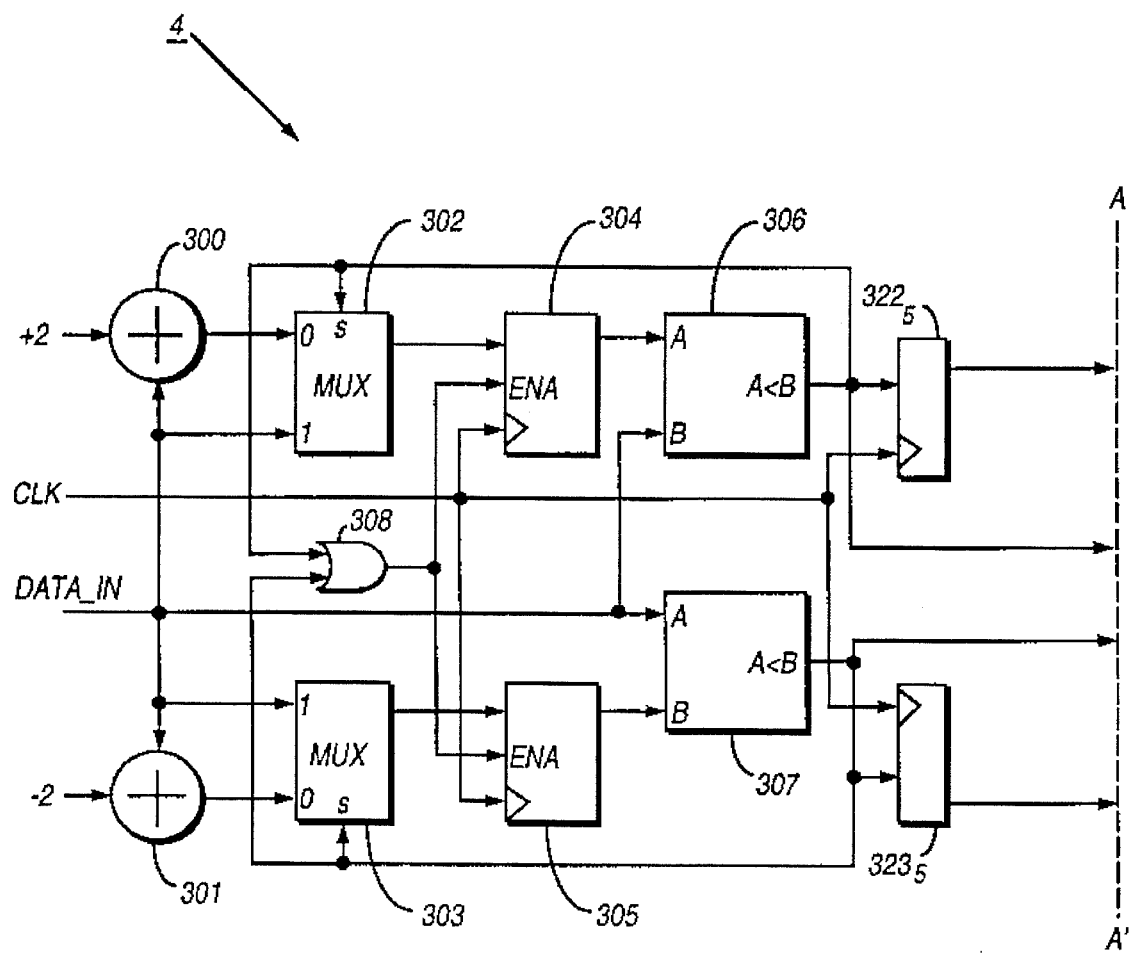
FIG. 9a and 9b show a detailed diagram of the two state 1-D sliding threshold Viterbi detector for the minimum latency embodiment of the present invention.
Figure 9B:
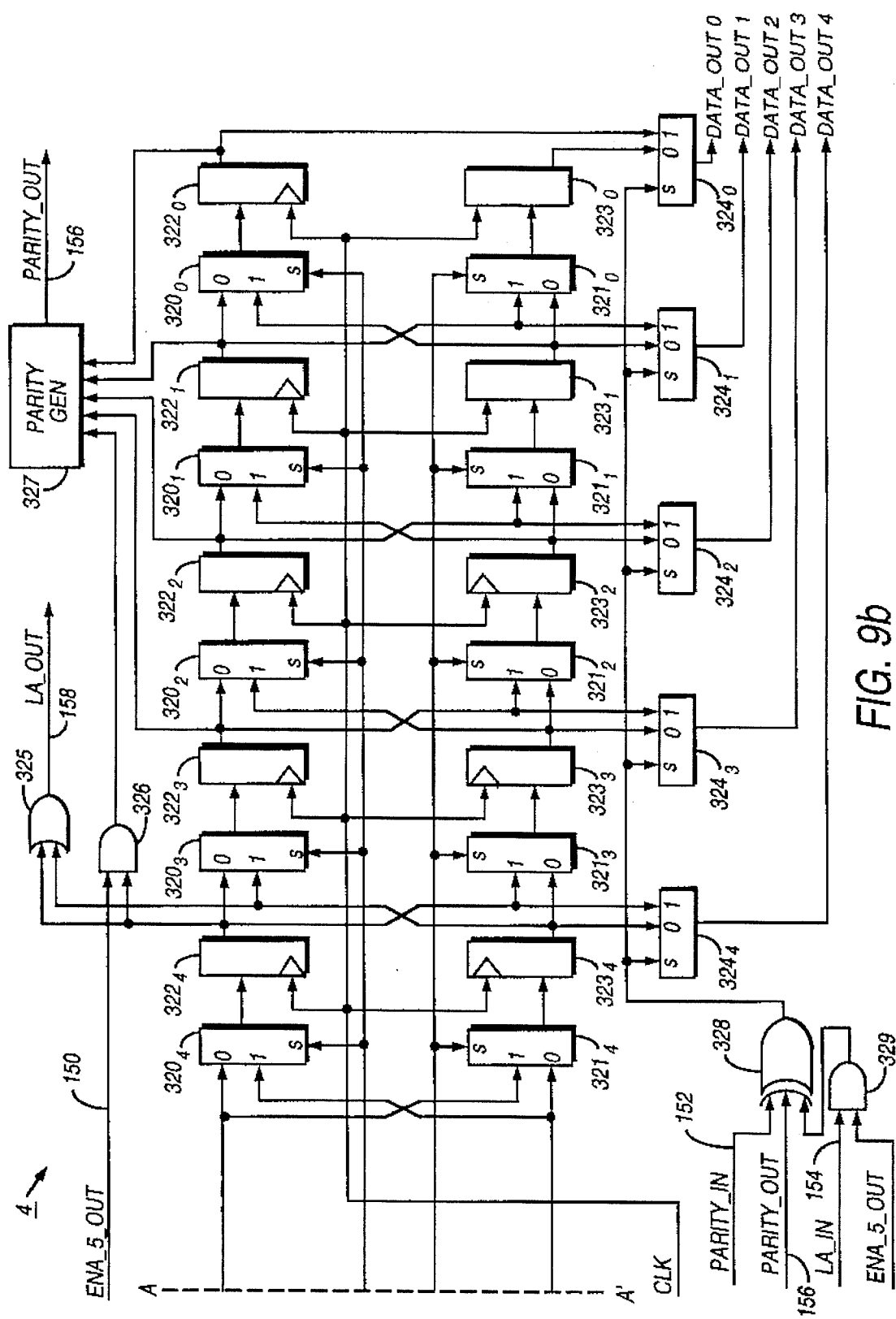

Details of detectors 200 and 202, which are identical, are shown in FIG. 9a and FIG. 9b. In FIG. 9a blocks 300 to 308 make up the sliding-threshold detector and flip-flops $322_5$ and $323_5$ are the first bits of the path memories. The data samples have been normalized to take on peak values of $-2$ or $+2$ when uncorrupted by noise. Each data sample is compared with the upper threshold stored in register 304 and the lower threshold stored in register 305. These registers are initialized to 0 before the start of detection.

If the sample is greater than the upper threshold, then comparator 306 outputs a "1" which sets the upper threshold to the current sample value and the lower threshold to the current sample value minus 2. A "0" is shifted into lower path memory 323, and a "1" is shifted into the first stage of upper path memory $322_5$. As a result, the path memories merge by loading upper path memory $322_0$ to $322_4$ with lower path memory $323_1$ to $323_5$ via MUXes 320 as shown in FIG. 9b.

If the sample is less than the lower threshold then comparator 307 outputs a "1" which sets the lower threshold to the current sample value and the upper threshold to the current sample value plus 2. A "0" is shifted into upper path memory 322, and a "1" is shifted into the first stage of lower path memory $323_5$. As a result, the path memories merge by loading lower path memory $323_0$ to $323_4$ with upper path memory $322_1$ to $322_5$ via MUXes 321 as shown in FIG. 9b.

If the sample value is between the upper and lower thresholds then the thresholds are unchanged and a "0" is shifted into both path memories.

When the path memories are unmerged, the detector must select one of the two paths am the output. The selection circuitry is shown in FIG. 9b. Parity generator 327 generates the parity (modulo-2 sum) of the last four bits of upper path memory 322 if input ENA__5__OUT 150 is "0" and generates the parity of the last five bits of upper path memory 322 if input ENA__5__OUT 150 is "1". The selection logic, consisting of AND gate 329 and XOR gate 328, connects to the selection inputs of MUXes 324.

The PARITY__IN 152 and LA__IN 154 inputs of FIG. 9b are the PARITY__OUT 156 and LA__OUT 158 outputs from the other detector as shown in FIG. 8. The parity generators and selection logic implement the following path selection rules:

1) If the five-bit even interleave is merged and the four-bit odd interleave is not merged, then the four-bit path memory is chosen such that the parity of the first codeword (output codeword) is odd. This is done by selecting the upper path memory if the XOR 328 of the two generated parities is "1", i.e. selecting the path which generated odd parity, and by selecting the lower path memory if the XOR 328 of the two generated parities is "0".

2) If the four-bit odd interleave is merged and the five-bit even interleave is not merged and the LA__IN 154 is "0" (i.e. the second codeword is a group 1 codeword), then the five-bit path memory is chosen such that the parity of the first codeword (output codeword) is odd. This is done by selecting the upper path memory if the XOR 328 of the two generated parities is "1", i.e. selecting the path which generated overall odd parity, and by selecting the lower path memory if the XOR 328 of the two generated parities is "0".

3) If the four-bit odd interleave is merged and the five-bit even interleave is not merged and the LA__IN 154 bit is "1" (i.e. the second codeword is a group 4 or 5 codeword), then the five-bit path memory is chosen such that the parity of the first codeword (output codeword) is even. This is done by selecting the upper path memory if the XOR 328 of the two generated parities is "0", i.e. selecting the path which generated overall even parity, and by selecting the lower path memory if the XOR 328 of the two generated parities is "1".

4) When both interleaves are merged then either path may be selected for output since both paths are identical.

Figure 10:
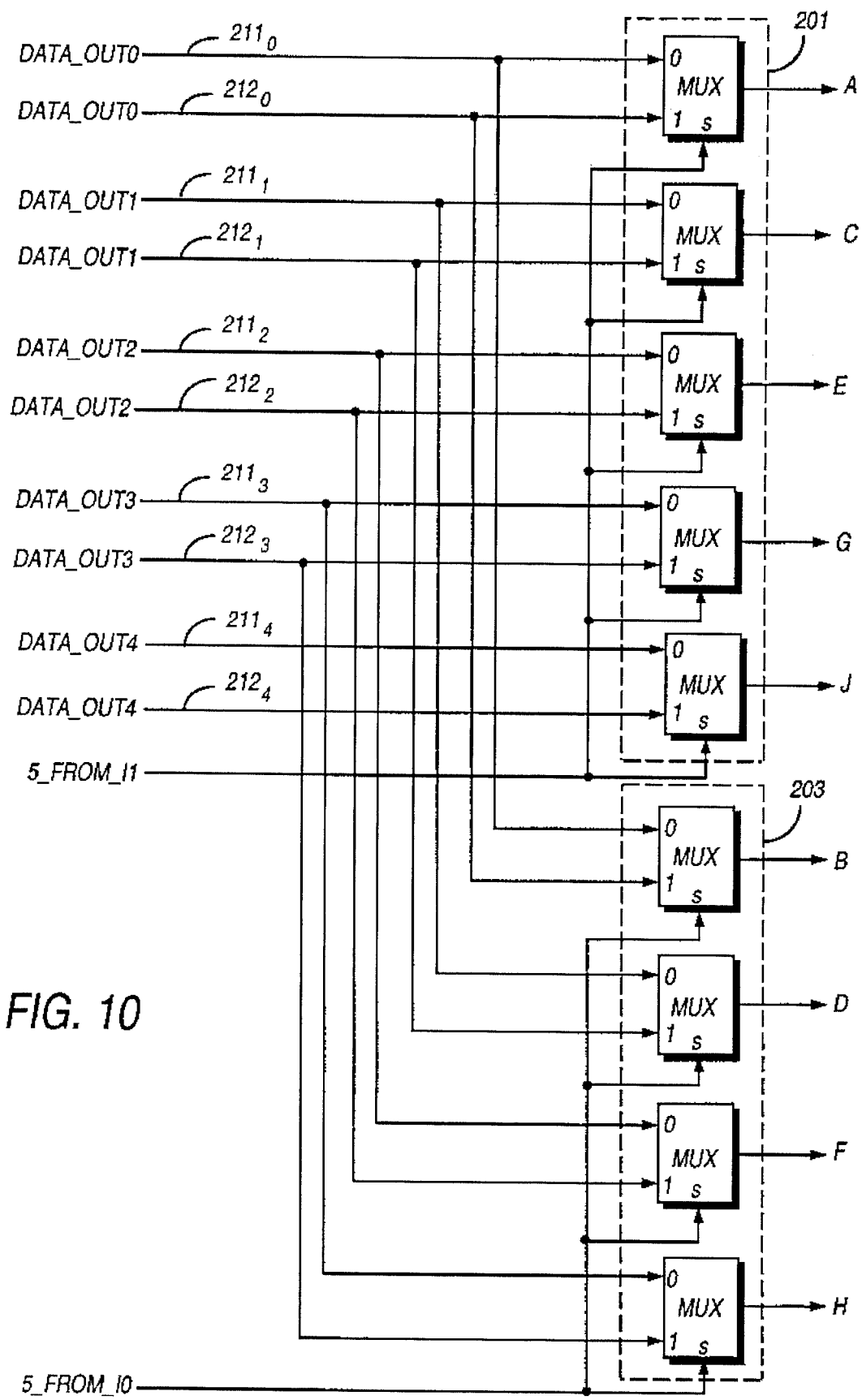
FIG. 10 shows the implementation of the multiplexor for selecting the output of the two state 1-D sliding threshold Viterbi detectors.

MUX block 210 in FIG. 8 which contains MUXes 201 and 203 is detailed in FIG. 10. The outputs from detector I0 200 are received on lines 211$_x$ and the outputs from detector I1 202 are received on lines 212$_x$. MUXes 201 select the five-bit interleave and MUXes 203 select the four-bit interleave. The nine outputs are then interleaved into the output codeword "ABCDEFGHJ" which feeds decoder block 5 in FIG. 1.

The decoder 5 in FIG. 1 can be implemented with either combinatorial logic or sequential logic or can be implemented as a look-up table, e.g. a ROM. A person skilled in the art could also implement the decoding scheme in software without departing from the scope and spirit of the invention. In the preferred embodiment, it is implemented with combinatorial logic and the logic equations are listed in Table 8 where "ABCDEFGHJ" is the input codeword and "abcdefgh" is the output byte. An exclamation "!" indicates an inverted term. "A" and "a" are the most significant bits of the input codeword and output byte, respectively.

TABLE 8

```
a =   A B C F J + A B C D J + A B C !D E + !A B !C +
      A C G +!B D F !J + !B E !F !J + A !B !E F !J +
      A !B !C + !B G.
b =   !B E !F !J + A B !C J + A B !C !H + A B !C !D E +
      !A !C D E !J + !C G + !B C + !A !B + !B D F !J.
c =   A B C !D !F !G J + A D E F !G + A B C D E +
      A C !D !E F !G !J + A B C !E !G !J +
      A !B !C G + !A B !C G + A !B !C D F !J +
      !B !D E F !G + E !G J + B E G + B D E F +
      A !B !C E + !A B !C D E.
d =   !B !C D E !J + !A !B D E !J + !B D E !F !J +
      A B G + B C G + E G.
e =   C !D E !F !G !J + B C D J + B C F J +
      A !B !C D F !G !J + !A !B D E F !G !J +
      !A !B !D E !F !G !J + A !B C !D !E !G !J +
      A B !D E !G + B C.
f =   A B !C !E F !G H !J + B C D E F + B !C D !E +
      A B D E + D G + D J.
g =   B C !E F + A B D F + A B !E F + F G + F J.
h =   B !D !F H !J + !A B !E !F H + !B H J + E H J +
      A !B C !D !E H + B C D F H + A !C !D !F H +
      A !C !E !F H + !A B !C !F H + A B D !E H +
      G H + F H J.
```

ERROR CORRECTING DETECTOR/DECODER

Figure 11A:
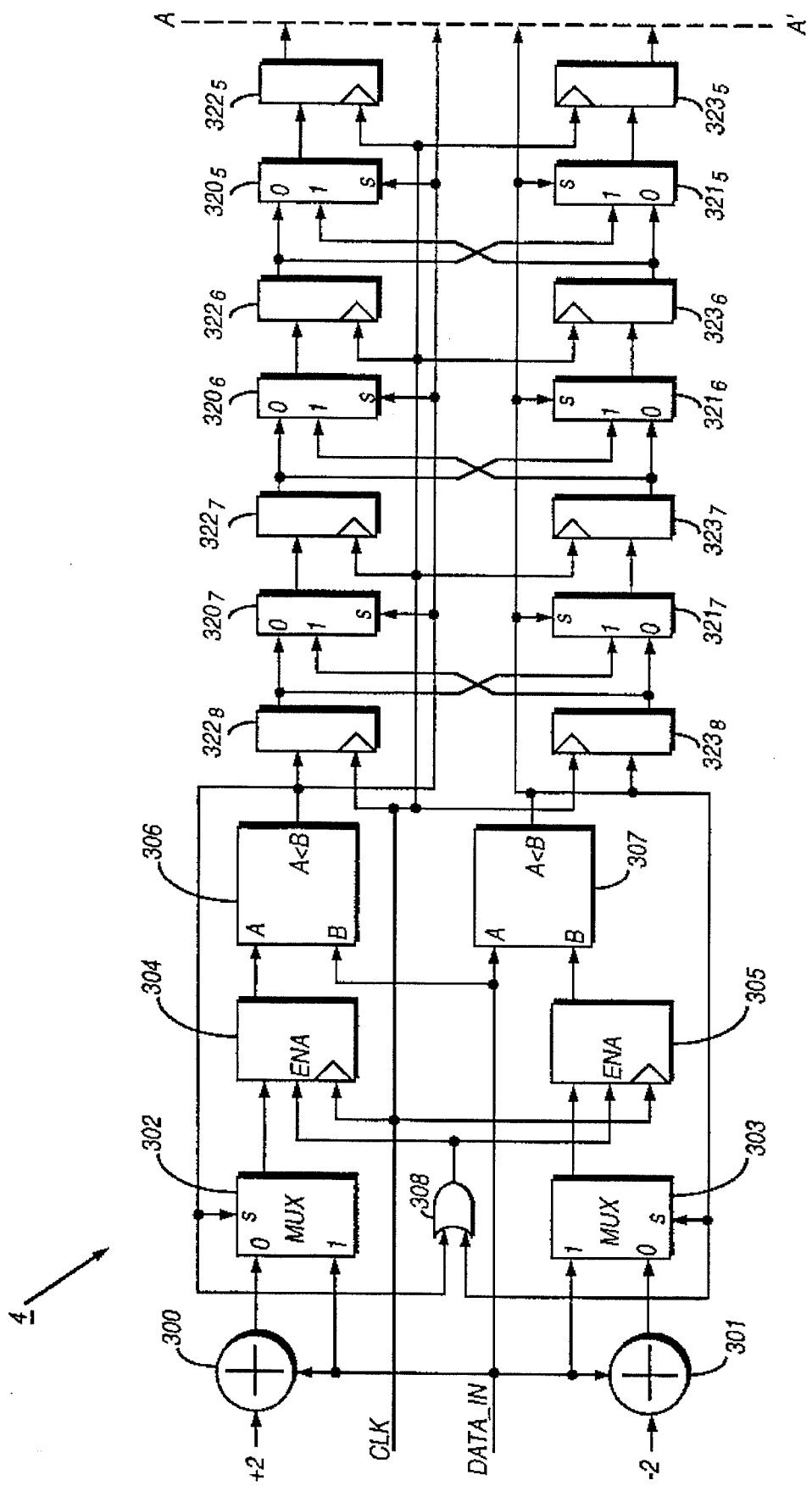
FIG. 11a and 11b show a detailed diagram of the two state 1-D sliding threshold Viterbi detector for the error correcting embodiment of the present invention.
Figure 11B:
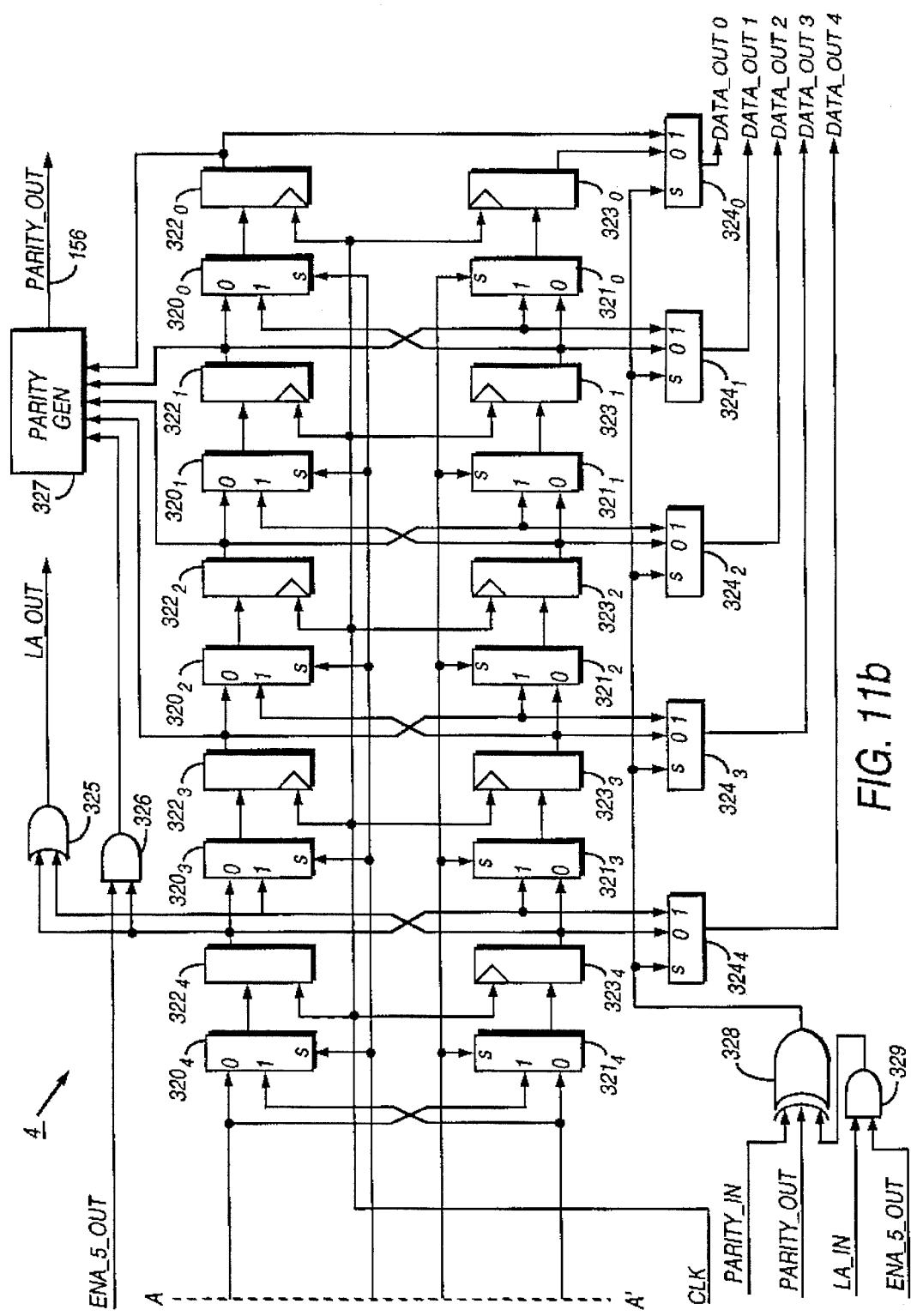

As described above, the Viterbi sequence detector for the error correcting embodiment of the present invention is the same as the minimum latency embodiment except that nine bits of the second codeword are stored rather than three. FIGS. 11a and 11b show the Viterbi detectors with the extended path memories. The comparator 205 in FIG. 8d compares the counter 205 output to 18 which is applied at line 119. When the counter output is 18, which is byte output time, counter 205 is loaded with 10 over line 118. The detectors 200 and 202 are shown in FIGS. 11a and 11b and are the same as FIGS. 9a and 9b with the exception that three bits of path memory are added to each detector as shown in FIG. 11a.

There are 512 different nine-bit sequences which can be output from the detector of which 276 are valid codewords. The remaining 236 sequences are invalid and indicate detection errors. The decoder maps each invalid sequence into a byte whose corresponding codeword differs from the invalid sequence in two contiguous positions within an interleave which is the most likely error that the PR4 detector can make given a typical magnetic disk read head response. This allows the decoder to correct many errors that are produced as a result of noisy samples. Table 9 lists the complete mapping of input sequences (SEQ) to output bytes (Data) in octal notation.

TABLE 9

| SEQ | Data | SEQ | Data | SEQ | Data | SEQ | Data |
|---|---|---|---|---|---|---|---|
| 000 | 320 | 200 | 060 | 400 | 206 | 600 | 236 |
| 001 | 052 | 201 | 156 | 401 | 202 | 601 | 216 |
| 002 | 142 | 202 | 061 | 402 | 207 | 602 | 231 |
| 003 | 053 | 203 | 151 | 403 | 203 | 603 | 217 |
| 004 | 026 | 204 | 326 | 404 | 002 | 604 | 226 |
| 005 | 036 | 205 | 336 | 405 | 206 | 605 | 236 |
| 006 | 027 | 206 | 321 | 406 | 003 | 606 | 221 |
| 007 | 037 | 207 | 331 | 407 | 207 | 607 | 231 |
| 010 | 320 | 210 | 062 | 410 | 230 | 610 | 232 |
| 011 | 350 | 211 | 152 | 411 | 200 | 611 | 212 |
| 012 | 141 | 212 | 063 | 412 | 204 | 612 | 233 |
| 013 | 050 | 213 | 153 | 413 | 200 | 613 | 213 |
| 014 | 320 | 214 | 322 | 414 | 000 | 614 | 222 |
| 015 | 330 | 215 | 332 | 415 | 230 | 615 | 232 |
| 016 | 024 | 216 | 323 | 416 | 000 | 616 | 223 |
| 017 | 034 | 217 | 333 | 417 | 204 | 617 | 233 |
| 020 | 341 | 220 | 310 | 420 | 241 | 620 | 244 |
| 021 | 056 | 221 | 250 | 421 | 102 | 621 | 256 |
| 022 | 343 | 222 | 310 | 422 | 243 | 622 | 244 |
| 023 | 057 | 223 | 270 | 423 | 103 | 623 | 251 |
| 024 | 046 | 224 | 066 | 424 | 006 | 624 | 266 |
| 025 | 210 | 225 | 070 | 425 | 106 | 625 | 276 |
| 026 | 047 | 226 | 061 | 426 | 007 | 626 | 261 |
| 027 | 307 | 227 | 071 | 427 | 107 | 627 | 271 |
| 030 | 341 | 230 | 210 | 430 | 241 | 630 | 245 |
| 031 | 350 | 231 | 230 | 431 | 250 | 631 | 252 |
| 032 | 341 | 232 | 210 | 432 | 241 | 632 | 245 |
| 033 | 054 | 233 | 240 | 433 | 100 | 633 | 253 |
| 034 | 360 | 234 | 062 | 434 | 260 | 634 | 262 |
| 035 | 370 | 235 | 072 | 435 | 270 | 635 | 272 |
| 036 | 044 | 236 | 063 | 436 | 004 | 636 | 263 |
| 037 | 304 | 237 | 073 | 437 | 104 | 637 | 273 |
| 040 | 120 | 240 | 064 | 440 | 205 | 640 | 234 |
| 041 | 150 | 241 | 154 | 441 | 201 | 641 | 214 |
| 042 | 142 | 242 | 065 | 442 | 205 | 642 | 235 |
| 043 | 051 | 243 | 155 | 443 | 201 | 643 | 215 |
| 044 | 120 | 244 | 324 | 444 | 001 | 644 | 224 |
| 045 | 130 | 245 | 334 | 445 | 205 | 645 | 234 |
| 046 | 025 | 246 | 325 | 446 | 001 | 646 | 225 |
| 047 | 035 | 247 | 335 | 447 | 205 | 647 | 235 |
| 050 | 022 | 250 | 066 | 450 | 206 | 650 | 236 |
| 051 | 052 | 251 | 156 | 451 | 202 | 651 | 216 |
| 052 | 143 | 252 | 060 | 452 | 207 | 652 | 237 |
| 053 | 053 | 253 | 157 | 453 | 203 | 653 | 217 |
| 054 | 026 | 254 | 326 | 454 | 002 | 654 | 226 |
| 055 | 036 | 255 | 336 | 455 | 206 | 655 | 236 |
| 056 | 027 | 256 | 327 | 456 | 003 | 656 | 227 |
| 057 | 037 | 257 | 337 | 457 | 207 | 657 | 237 |
| 060 | 342 | 260 | 260 | 460 | 242 | 660 | 246 |
| 061 | 150 | 261 | 110 | 461 | 220 | 661 | 254 |
| 062 | 342 | 262 | 260 | 462 | 242 | 662 | 246 |
| 063 | 055 | 263 | 211 | 463 | 101 | 663 | 255 |
| 064 | 160 | 264 | 064 | 464 | 060 | 664 | 264 |
| 065 | 170 | 265 | 074 | 465 | 070 | 665 | 274 |
| 066 | 045 | 266 | 065 | 466 | 005 | 666 | 265 |
| 067 | 305 | 267 | 075 | 467 | 105 | 667 | 275 |
| 070 | 343 | 270 | 220 | 470 | 243 | 670 | 247 |
| 071 | 056 | 271 | 140 | 471 | 102 | 671 | 256 |
| 072 | 343 | 272 | 220 | 472 | 243 | 672 | 247 |
| 073 | 057 | 273 | 340 | 473 | 103 | 673 | 257 |
| 074 | 046 | 274 | 066 | 474 | 006 | 674 | 266 |
| 075 | 306 | 275 | 076 | 475 | 106 | 675 | 276 |
| 076 | 047 | 276 | 067 | 476 | 007 | 676 | 267 |
| 077 | 307 | 277 | 077 | 477 | 107 | 677 | 277 |
| 100 | 032 | 300 | 136 | 500 | 036 | 700 | 336 |
| 101 | 012 | 301 | 116 | 501 | 016 | 701 | 316 |
| 102 | 033 | 302 | 131 | 502 | 037 | 702 | 331 |
| 103 | 013 | 303 | 111 | 503 | 017 | 703 | 311 |
| 104 | 022 | 304 | 126 | 504 | 026 | 704 | 326 |
| 105 | 032 | 305 | 136 | 505 | 036 | 705 | 336 |
| 106 | 023 | 306 | 121 | 506 | 027 | 706 | 321 |
| 107 | 033 | 307 | 131 | 507 | 037 | 707 | 331 |

TABLE 9-continued

| SEO | Data | SEO | Data | SEO | Data | SEO | Data |
|---|---|---|---|---|---|---|---|
| 110 | 330 | 310 | 132 | 510 | 330 | 710 | 332 |
| 111 | 010 | 311 | 112 | 511 | 310 | 711 | 312 |
| 112 | 030 | 312 | 133 | 512 | 034 | 712 | 333 |
| 113 | 010 | 313 | 113 | 513 | 014 | 713 | 313 |
| 114 | 320 | 314 | 122 | 514 | 320 | 714 | 322 |
| 115 | 330 | 315 | 132 | 515 | 330 | 715 | 332 |
| 116 | 020 | 316 | 123 | 516 | 024 | 716 | 323 |
| 117 | 030 | 317 | 133 | 517 | 034 | 717 | 333 |
| 120 | 141 | 320 | 144 | 520 | 341 | 720 | 344 |
| 121 | 052 | 321 | 156 | 521 | 056 | 721 | 356 |
| 122 | 143 | 322 | 144 | 522 | 343 | 722 | 344 |
| 123 | 053 | 323 | 151 | 523 | 057 | 723 | 351 |
| 124 | 042 | 324 | 166 | 524 | 046 | 724 | 366 |
| 125 | 302 | 325 | 176 | 525 | 210 | 725 | 376 |
| 126 | 043 | 326 | 161 | 526 | 047 | 726 | 361 |
| 127 | 303 | 327 | 171 | 527 | 307 | 727 | 371 |
| 130 | 141 | 330 | 145 | 530 | 341 | 730 | 345 |
| 131 | 350 | 331 | 152 | 531 | 350 | 731 | 352 |
| 132 | 141 | 332 | 145 | 532 | 341 | 732 | 345 |
| 133 | 050 | 333 | 153 | 533 | 054 | 733 | 353 |
| 134 | 360 | 334 | 162 | 534 | 360 | 734 | 362 |
| 135 | 370 | 335 | 172 | 535 | 370 | 735 | 372 |
| 136 | 040 | 336 | 163 | 536 | 044 | 736 | 363 |
| 137 | 300 | 337 | 173 | 537 | 304 | 737 | 373 |
| 140 | 130 | 340 | 134 | 540 | 130 | 740 | 334 |
| 141 | 011 | 341 | 114 | 541 | 110 | 741 | 314 |
| 142 | 031 | 342 | 135 | 542 | 035 | 742 | 335 |
| 143 | 011 | 343 | 115 | 543 | 015 | 743 | 315 |
| 144 | 120 | 344 | 124 | 544 | 120 | 744 | 324 |
| 145 | 130 | 345 | 134 | 545 | 130 | 745 | 334 |
| 146 | 021 | 346 | 125 | 546 | 025 | 746 | 325 |
| 147 | 031 | 347 | 135 | 547 | 035 | 747 | 335 |
| 150 | 032 | 350 | 136 | 550 | 036 | 750 | 336 |
| 151 | 012 | 351 | 116 | 551 | 016 | 751 | 316 |
| 152 | 033 | 352 | 137 | 552 | 037 | 752 | 337 |
| 153 | 013 | 353 | 117 | 553 | 017 | 753 | 317 |
| 154 | 022 | 354 | 126 | 554 | 026 | 754 | 326 |
| 155 | 032 | 355 | 136 | 555 | 036 | 755 | 336 |
| 156 | 023 | 356 | 127 | 556 | 027 | 756 | 327 |
| 157 | 033 | 357 | 137 | 557 | 037 | 757 | 337 |
| 160 | 142 | 360 | 146 | 560 | 342 | 760 | 346 |
| 161 | 150 | 361 | 154 | 561 | 150 | 761 | 354 |
| 162 | 142 | 362 | 146 | 562 | 342 | 762 | 346 |
| 163 | 051 | 363 | 155 | 563 | 055 | 763 | 355 |
| 164 | 160 | 364 | 164 | 564 | 160 | 764 | 364 |
| 165 | 170 | 365 | 174 | 565 | 170 | 765 | 374 |
| 166 | 041 | 366 | 165 | 566 | 045 | 766 | 365 |
| 167 | 301 | 367 | 175 | 567 | 305 | 767 | 375 |
| 170 | 143 | 370 | 147 | 570 | 343 | 770 | 347 |
| 171 | 052 | 371 | 156 | 571 | 056 | 771 | 356 |
| 172 | 143 | 372 | 147 | 572 | 343 | 772 | 347 |
| 173 | 053 | 373 | 157 | 573 | 057 | 773 | 357 |
| 174 | 042 | 374 | 166 | 574 | 046 | 774 | 366 |
| 175 | 302 | 375 | 176 | 575 | 306 | 775 | 376 |
| 176 | 043 | 376 | 167 | 576 | 047 | 776 | 367 |
| 177 | 303 | 377 | 177 | 577 | 307 | 777 | 377 |

The decoder can be implemented with either combinatorial logic or sequential logic or can be implemented as a look-up table, e.g. a ROM. A person skilled in the art could also implement the decoding scheme in software without departing from the scope and spirit of the invention. In the preferred embodiment it is implemented with combinatorial logic and the logic equations are listed in Table 10 where "ABCDEFGHJ" is the input codeword and "abcdefgh" is the output byte. An exclamation "!" indicates an inverted term. "A" and "a" are the most significant bits of the input codewod and output byte, respectively.

TABLE 10 a =  !B !C !D F !H J + !B !D !E F !G !H !J + !B C !D E G J +
     !B C E F G J + A !D E F !H + !B C E G H J +

TABLE 10-continued

```
      A !C !G !J + !A !B !D F G !H +A C !D F !H +
      !A !B E G H J + !A !B !D E G J + !C E !G !J +
      !B !D E F !H J + !B !C !D !G !H !J + !A !B E F G J +
      B !C !E G + A E !G !J + B !C E !G H + A !C !E J +
      AB + B !C !D E !G + A !C D !F !G !H.
b =   C !D F G !H + C D !F !H !J + C !D E F !H +
      C D E !F !H + !A !B !C !F !G !J + !B D E F G J +
      !A !C D !F !G !H J + C !D F !H !J + !A !B !C !D F !H +
      !A !B D !F G !H + !B E G H J + A !B !C E H J +
      !A !B !C !G H !J + A !B !C !D E !F J +
      A !B !C D E F J + !A !B E !G !J + !A B !E G +
      !A B !E J + A C !D F !H + !A !D E !F !G !J +
      C E !G !J + A C D !F !H + !A B D F !G J + B C +
      !A C E G J.
c =   B !D E! F J + D E !F !G !J + B D E F J +
      B !D E H J + !B !D E F !H + !A E G !J +
      !A !B !C !G J + !A !B !C !G H + !B E !G !J +
      !A B !C !E !G + D E !F G !H + C E !J + A B E +
      C E !G + B E G.
d =   A !B !C D E !F !H J + !A B !C !D E !F H J +
      !A B !C !D E F !H J + C !E !J + !D !E F !G !H !J +
      !A B !C D !J + !D E F G !H + D E !F G !H +
      !A !E !H !J + B !E !J + B G + C !E G +
      !A !E G + !D F G !H J.
e =   ·A C !F !H J + !A !F !G J + !A !C !F !H J +
      !A B !C !D E !G !J + A !D !E F !G !H !J +
      C !E !G + A B !E !G + D E !F G !H J + !D F G !H J +
      B G J + !A !E J + !A !B !G J + !D E F !H J + C !E J +
      C !G J + A B J.
f =   A C D !E F + A !C D !E !G !J + !A !C !D !F G !H !J +
      A C !D !F !G !H J + A !D !E !F G !H J +
      !C !D !E !F G !H J + A !D !E !F !G !H !J +
      A !C D !E G J + A !C !D E !F G !H + A D E F G +
      A !B C G H + A C !D !F G !H !J + A !B E G H +
      !B !C G H J + !A !B !C E H J + !A !B !C !D E !F !G J +
      !A !B !C G H + B C E !G !J + A !B C H J +
      A !B !E G H !J + !A !B !C D E F J + B C !F !H +
      B !E !F !H J + A B E !G !J + !A !C D F G +
      A C D F J + A B !F !H + B C D + B D !E !H +
      A B !C !E !F !G J + B D !E J + B D !E !F + A B D +
      B D G.
g =   !A !B !C !F !G H !J + A D F + C D F + D !E F J +
      A !C !D !E !F !G J + B C !D !H J + !A C !D !F !H J +
      A !C !D !F !H J + A !D !E !F H + D !E F !H +
      C !D !E !F !H + !D !F G !H !J + !D !E !F !H J +
      !B !D !F H + !B D E !G !J + !B !D !F !G J +
      C D E !G !J + A D E !G !J + !B D F +
      B F G + B !D !E F + B C F J + A B F J.
h =   A !E !F H + C !F H J + !A !C !D !E F !G H !J +
      A B F H + A B H J + C !E !F H + B !E H J +
      !B !F H J + !B D F H + B C F H + !B !D E !G !J +
      C E F !G !J + A E F !G !J + !B E F !G !J +
      !A !B C D !E !F !G J + A !B !C D !E !F + B G H +
      !F G H + B !E !F H + D !F H J.
```

1-D² VITERBI DETECTOR

An alternative embodiment of the detector 4 is to use a four state 1-D² Viterbi detector rather than a pair of two state 1-D sliding threshold Viterbi detectors. Except for the Viterbi algorithm, the operation of the encoding and decoding scheme is exactly as described above. FIG. 12 shows a circuit diagram for the 1-D² Viterbi detector 4 embodiment.

Block 120 implements the 1-D² Viterbi algorithm and the path memories 122 store nine bits 126 of a first codeword and three bits 124 of a second (following) codeword. To understand the invention, each path memory represents a state of the trellis diagram as shown in FIG. 5. Parity Generator 128 generates the parity of the five bit even interleave of the first codeword, and Parity Generator 130 generates the parity for the four bit odd interleave. Multiplexors 132 and 134 output the first codeword 14 by selecting the path memory based on the parity as determined by the second codeword as described above. The first look-ahead bit of the second codeword generated by OR gate 136, is used for selecting the parity of the first codeword when the five bit even interleave has not merged.

What has been disclosed and described is a novel method or encoding, detecting and decoding data in a PR class-IV digital magnetic recording channel. By utilizing parity information from the encoded codewords, the interleave constraint on the maximum number of zeros in conventional systems is avoided. As a result, the path memory and latency of the Viterbi detector is minimized. A further benefit is the ability to correct for certain errors caused when a "1" bit is erased due to noise in the system.

Those skilled in the art can appreciate that the aspects of the invention can be achieved in various differing embodiments, in circuitry or in software, without departing from the spirit and scope of the invention. Further, the application of the present invention to RLL coding schemes, other than those disclosed, is apparent. The specific RLL coding constraints disclosed is intended to be illustrative and is not meant to limit the scope of the invention as appropriately construed by the following claims.

I claim:

1. An apparatus for encoding an input stream of binary data into an output stream of binary codewords, comprising:
   (a) a receiver connected to receive the input stream of binary data;
   (b) an encoder means, connected to the receiver, for encoding a predetermined j number of bits from the input stream into a codeword comprising a predetermined k number of bits, said encoder generating the output stream of binary codewords; and
   (c) a parity means for generating a parity signal having two states, active and inactive, connected to receive the codewords from the encoder, responsive to the number of "1" bits in at least part of at least one codeword generated by the encoder, said encoder utilizing the parity signal for encoding the input stream of binary data into the codewords,
wherein:
   (a) the codewords are selected from a first and second plurality of codewords;
   (b) the codewords comprising an even and odd interleave subsequence, the odd interleave consisting only of odd bit positions of the codeword and the even interleave consisting of even bit positions of the codeword;
   (c) the codewords out of the first plurality of codewords have at least one "1" bit in both interleaves within a predetermined first N bit positions of the codeword; and
   (d) the codewords out of the second plurality of codewords have at least one "1" bit in one interleave and zero "1" bits in the other interleave within the first N bit positions of the codeword.

2. The apparatus as recited in claim 1, wherein j is 8, k is 9, and N is 3.

3. The apparatus as recited in claim 1, wherein:
   (a) the second plurality of codewords comprises a third and fourth plurality of codewords;
   (b) the codewords out of the third plurality of codewords have at least one "1" bit in the even interleave and zero "1" bits in the odd interleave within the first N bit positions of the codeword;
   (c) the codewords out of the fourth plurality of codewords have at least one "1" bit in the odd interleave and zero "1" bits in the even interleave within the first N bit positions of the codeword;
   (d) the encoder generates codewords out of the third plurality of codewords if the parity signal is active; and
   (e) the encoder generates codewords out of the fourth plurality of codewords if the parity signal is inactive.

4. The apparatus as recited in claim 1, wherein:
   (a) the second plurality of codewords comprises a third, fourth, fifth, and sixth plurality of codewords;
   (b) the codewords out of the third plurality of codewords having a {0, 0, 1} bit sequence as the first three bits;
   (c) the codewords out of the fourth plurality of codewords having a {0, 1, 0} bit sequence as the first three bits;
   (d) the codewords out of the fifth plurality of codewords having a {1, 0, 0} bit sequence as the first three bits;
   (e) the codewords out of the sixth plurality of codewords having a {1, 0, 1} bit sequence as the first three bits;
   (f) the encoder generates codewords out of the third and fourth plurality of codewords if the parity signal is in the active state; and
   (g) the encoder generates codewords out of the fifth and sixth plurality of codewords if the parity signal is in the inactive state.

5. An apparatus for encoding an input stream of binary data into an output stream of binary codewords, comprising:
   (a) a receiver connected to receive the input stream of binary data;
   (b) an encoder means, connected to the receiver, for encoding a predetermined j number of bits from the input stream into a codeword comprising a predetermined k number of bits, said encoder generating the output stream of binary codewords; and
   (c) a parity means for generating a parity signal having two states, active and inactive, connected to receive the codewords from the encoder, responsive to the number of "1" bits in at least part of at least one codeword generated by the encoder, said encoder utilizing the parity signal for encoding the input stream of binary data into the codewords,
wherein:
   (a) the codewords are selected from a first and second plurality of codewords;
   (b) the codewords comprising an even and odd interleave subsequence, the odd interleave consisting only of odd bit positions of the codeword and the even interleave consisting of even bit positions of the codeword;
   (c) the codewords out of the first plurality of codewords have at least two "1" bits in both interleaves within a predetermined first M bit positions of the codeword; and
   (d) the codewords out of the second plurality of codewords have at least one "1" bit in one interleave and less than two "1" bits in the other interleave within a predetermined first M bit positions of the codeword.

6. The apparatus as recited in claim 5, wherein j is 8, k is 9, and M is 9.

7. The apparatus as recited in claim 5, wherein:
   (a) the second plurality of codewords comprises a third and fourth plurality of codewords;
   (b) the codewords out of the third plurality of codewords have at least one "1" bit in the even interleave and less than two "1" bits in the odd interleave within the first M bit positions of the codeword;
   (c) the codewords out of the fourth plurality of codewords have at least one "1" bit in the odd interleave and less than two "1" bits in the even interleave within the first M bit positions of the codeword;

(d) the encoder generates codewords out of the third plurality of codewords if the parity signal is active; and (e) the encoder generates codewords out of the fourth plurality of codewords if the parity signal is inactive.

8. An apparatus for encoding a stream of binary data into a stream of binary codewords utilized in PRML communication channels, said PRML communication channel comprising at least one sequence detector, said apparatus for encoding comprising:

(a) an encoder for encoding a predetermined j number of bits from the data stream of binary data into a codeword comprising a predetermined k number of bits, said encoder generating the stream of binary codewords; an (b) a parity generator for generating a parity signal having two states, active and inactive, responsive to the number of "1" bits in at least part of at least one codeword generated by the encoder, said encoder utilizing the parity signal for encoding the stream of binary data into the codewords, wherein:

(a) the codewords generated are selected from a first and second plurality of codewords;

(b) the sequence detector comprises four path memories;

(c) the four path memories merge into a single survivor sequence comprising at least k bits after the sequence detector processes a predetermined first N number of bits out of the codewords selected from the first plurality of codewords; and (d) the four path memories merge into two survivor sequences comprising at least k bits each and different in only one bit after the sequence detector processes the first N number of bits out of the codewords selected from the second plurality of codewords.

9. The apparatus as recited in claim 8, wherein j is 8, k is 9, and N is 3.

10. The apparatus as recited in claim 8, wherein:

(a) the second plurality of codewords comprises a third and fourth plurality of codewords;

(b) the codewords out of the third plurality of codewords have at least one "1" bit in the even interleave and zero "1" bits in the odd interleave within the first N bit positions of the codeword;

(c) the codewords out of the fourth plurality of codewords have at least one "1" bit in the odd interleave and zero "1" bits in the even interleave within the first N bit positions of the codeword;

(d) the encoder generates codewords out of the third plurality of codewords if the parity signal is active; and (e) the encoder generates codewords out of the fourth plurality of codewords if the parity signal is inactive.

11. The apparatus as recited in claim 8, wherein:

(a) the second plurality of codewords comprises a third, fourth, fifth, and sixth plurality of codewords;

(b) the codewords out of the third plurality of codewords having a {0, 0, 1} bit sequence as the first three bits;

(c) the codewords out of the fourth plurality of codewords having a {0, 1, 0} bit sequence as the first three bits;

(d) the codewords out of the fifth plurality of codewords having a {1, 0, 0} bit sequence as the first three bits;

(e) the codewords out of the sixth plurality of codewords having a {1, 0, 1} bit sequence as the first three bits;

(f) the encoder generates codewords out of the third and fourth plurality of codewords if the parity signal is active; and (g) the encoder generates codewords out of the fifth and sixth plurality of codewords if the parity signal is inactive.

12. An apparatus for encoding a stream of binary data into a stream of binary codewords utilized in PRML communication channels, said PRML communication channel comprising at least one sequence detector, said apparatus for encoding comprising:

(a) an encoder for encoding a predetermined j number of bits from the data stream of binary data into a codeword comprising a predetermined k number of bits, said encoder generating the stream of binary codewords; and (b) a parity generator for generating a parity signal having two states, active and inactive, responsive to the number of "1" bits in at least part of at least one codeword generated by the encoder, said encoder utilizing the parity signal for encoding the stream of binary data into the codewords, wherein:

(a) the codewords generated are selected from a first and second plurality of codewords;

(b) the sequence detector comprises a first and second sliding threshold sequence detector having two path memories each, the first and second sequence detectors processing the even and odd interleaves of the binary data stream respectively;

(c) the two path memories of the first and second sequence detector merge into a first and second survivor sequence comprising a total of at least k bits after the sequence detectors process a predetermined first N number of bits out of the codewords selected from the first plurality of codewords; and (d) one of the path memories does not merge into the corresponding survivor sequence after the sequence detectors process the first N number of bits out of the codewords selected from the second plurality of codewords.

13. The apparatus as recited in claim 12, wherein j is 8, k is 9, and N is 3.

14. The apparatus as recited in claim 12, wherein:

(a) the second plurality of codewords comprises a third and fourth plurality of codewords;

(b) the codewords out of the third plurality of codewords have at least one "1" bit in the even interleave and zero "1" bits in the odd interleave within the first N bit positions of the codeword;

(c) the codewords out of the fourth plurality of codewords have at least one "1" bit in the odd interleave and zero "1" bits in the even interleave within the first N bit positions of the codeword;

(d) the encoder generates codewords out of the third plurality of codewords if the parity signal is active; and (e) the encoder generates codewords out of the fourth plurality of codewords if the parity signal is inactive.

15. The apparatus as recited in claim 12, wherein:

(a) the second plurality of codewords comprises a third, fourth, fifth, and sixth plurality of codewords;

(b) the codewords out of the third plurality of codewords having a {0, 0, 1} bit sequence as the first three bits;

(c) the codewords out of the fourth plurality of codewords having a {0, 1, 0} bit sequence as the first three bits;

(d) the codewords out of the fifth plurality of codewords having a {1, 0, 0} bit sequence as the first three bits;

(e) the codewords out of the sixth plurality of codewords having a {1, 0, 1} bit sequence as the first three bits;

(f) the encoder generates codewords out of the third and fourth plurality of codewords if the parity signal is active; and (g) the encoder generates codewords out of the fifth and sixth plurality of codewords if the parity signal is inactive.

16. An apparatus for encoding a stream of binary data into a stream of binary codewords utilized in PRML communication channels, said PRML communication channel comprising at least one sequence detector, said apparatus for encoding comprising:

(a) an encoder for encoding a predetermined j number of bits from the data stream of binary data into a codeword comprising a predetermined k number of bits, said encoder generating the stream of binary codewords; and (b) a parity generator for generating a parity signal having two states, active and inactive, responsive to the number of "1" bits in at least part of at least one codeword generated by the encoder, said encoder utilizing the parity signal for encoding the stream of binary data into the codewords, wherein:

(a) the sequence detector comprises four path memories; and (b) the codewords generated are selected from a first and second plurality of codewords such that when a "1" bit out of at least one of the codewords is changed to a "0":

(a) the four path memories merge into a single survivor sequence comprising at least k bits after the sequence detector processes a predetermined first M number of bits out of the codewords selected from the first plurality of codewords; and (b) the four path memories merge into two survivor sequences comprising at least k bits each and different in only one bit after the sequence detector processes the first M number of bits out of the codewords selected from the second plurality of codewords.

17. The apparatus as recited in claim 16, wherein j is 8, k is 9, and M is 9.

18. The apparatus as recited in claim 16, wherein:

(a) the second plurality of codewords comprises a third and fourth plurality of codewords;

(b) the codewords out of the third plurality of codewords have at least one "1" bit in the even interleave and less than two "1" bits in the odd interleave within the first M bit positions of the codeword;

(c) the codewords out of the fourth plurality of codewords have at least one "1" bit in the odd interleave and less than two "1" bits in the even interleave within the first M bit positions of the codeword;

(d) the encoder generates codewords out of the third plurality of codewords if the parity signal is active; and (e) the encoder generates codewords out of the fourth plurality of codewords if the parity signal is inactive.

19. An apparatus for encoding a stream of binary data into a stream of binary codewords utilized in PRML communication channels, said PRML communication channel comprising at least one sequence detector, said apparatus for encoding comprising:

(a) an encoder for encoding a predetermined j number of bits from the data stream of binary data into a codeword comprising a predetermined k number of bits, said encoder generating the stream of binary codewords; and (b) a parity generator for generating a parity signal having two states, active and inactive, responsive to the number of "1" bits in at least part of at least one codeword generated by the encoder, said encoder utilizing the parity signal for encoding the stream of binary data into the codewords, wherein:

(a) the binary data stream comprising an even and odd interleave subsequence, the odd interleave consisting only of odd bit positions of the binary data stream and the even interleave consisting of even bit positions of the binary data stream;

(b) the sequence detector comprises a first and second sliding threshold sequence detector having two path memories each, the first and second sequence detectors processing the even and odd interleaves of the binary data stream respectively; and (c) the codewords generated are selected from a first and second plurality of codewords such that when a "1" bit out of at least one of the codewords is changed to a "0":

(a) the two path memories of both sequence detectors merge into a corresponding first and second survivor sequence comprising a total of at least k bits after the sequence detectors process a predetermined first M number of bits out of the codewords selected from the first plurality of codewords; and (b) the two path memories of one of the sequence detectors do not merge into the corresponding survivor sequence after the sequence detectors process the first M number of bits out of the codewords selected from the second plurality of codewords.

20. The apparatus as recited in claim 19, wherein j is 8, k is 9, and M is 9.

21. The apparatus as recited in claim 19, wherein:

(a) the second plurality of codewords comprises a third and fourth plurality of codewords;

(b) the encoder generates codewords out of the third plurality of codewords if the parity signal is active; and (c) the encoder generates codewords out of the fourth plurality of codewords if the parity signal is inactive.

22. A method for encoding an input stream of binary data into an output stream of binary codewords, comprising the steps of:

(a) receiving the input stream of binary data;

(b) encoding a predetermined j number of bits from the input stream into a codeword comprising a predetermined k number of bits; and (c) generating a parity signal having two states, active and inactive, responsive to the number of "1" bits in at least part of at least one codeword generated in step (b), said encoding in step (b) utilizing the parity signal for encoding the input stream of binary data into the codewords, wherein:

(a) the codewords are selected from a first and second plurality of codewords;

(b) the codewords comprising an even and odd interleave subsequence, the odd interleave consisting only of odd bit positions of the codeword and the even interleave consisting of even bit positions of the codeword;

(c) the codewords out of the first plurality of codewords have at least one "1" bit in both interleaves within a predetermined first N bit positions of the codeword; and (d) the codewords out of the second plurality of codewords have at least one "1" bit in one interleave and zero "1" bits in the other interleave within the first N bit positions of the codeword.

23. The method as recited in claim 22, wherein j is 8, k is 9, and N is 3.

24. The method as recited in claim 22, wherein:

(a) the second plurality of codewords comprises a third and fourth plurality of codewords;

(b) the codewords out of the third plurality of codewords have at least one "1" bit in the even interleave and zero "1" bits in the odd interleave within the first N bit positions of the codeword;

(c) the codewords out of the fourth plurality of codewords have at least one "1" bit in the odd interleave and zero "1" bits in the even interleave within the first N bit positions of the codeword;

(d) the encoder generates codewords out of the third plurality of codewords if the parity signal is active; and (e) the encoder generates codewords out of the fourth plurality of codewords if the parity signal is inactive.

25. The method as recited in claim 22, wherein:

(a) the second plurality of codewords comprises a third, fourth, fifth, and sixth plurality of codewords;

(b) the codewords out of the third plurality of codewords having a {0, 0, 1} bit sequence as the first three bits;

(c) the codewords out of the fourth plurality of codewords having a {0, 1, 0} bit sequence as the first three bits;

(d) the codewords out of the fifth plurality of codewords having a {1, 0, 0} bit sequence as the first three bits;

(e) the codewords out of the sixth plurality of codewords having a {1, 0, 1} bit sequence as the first three bits;

(f) the encoder generates codewords out of the third and fourth plurality of codewords if the parity signal is in the active state; and (g) the encoder generates codewords out of the fifth and sixth plurality of codewords if the parity signal is in the inactive state.

26. A method for encoding an input stream of binary data into an output stream of binary codewords, comprising the steps of:

(a) receiving the input stream of binary data;

(b) encoding a predetermined j number of bits from the input stream into a codeword comprising a predetermined k number of bits; and (c) generating a parity signal having two states, active and inactive, responsive to the number of "1" bits in at least part of at least one codeword generated in step (b), said encoding in step (b) utilizing the parity signal for encoding the input stream of binary data into the codewords, wherein:

(a) the codewords are selected from a first and second plurality of codewords;

(b) the codewords comprising an even and odd interleave subsequence, the odd interleave consisting only of odd bit positions of the codeword and the even interleave consisting of even bit positions of the codeword;

(c) the codewords out of the first plurality of codewords have at least two "1" bits in both interleaves within a predetermined first M bit positions of the codeword; and (d) the codewords out of the second plurality of codewords have at least one "1" bit in one interleave and less than two "1" bits in the other interleave within a predetermined first M bit positions of the codeword.

27. The method as recited in claim 26, wherein j is 8, k is 9, and M is 9.

28. The method as recited in claim 26, wherein:

(a) the second plurality of codewords comprises a third and fourth plurality of codewords;

(b) the codewords out of the third plurality of codewords have at least one "1" bit in the even interleave and less than two "1" bits in the odd interleave within the first M bit positions of the codeword;

(c) the codewords out of the fourth plurality of codewords have at least one "1" bit in the odd interleave and less than two "1" bits in the even interleave within the first M bit positions of the codeword;

(d) the encoder generates codewords out of the third plurality of codewords if the parity signal is active; and (e) the encoder generates codewords out of the fourth plurality of codewords if the parity signal is inactive.

29. A method for encoding a stream of binary data into a stream of binary codewords utilized in PRML communication channels, said PRML communication channel comprising at least one sequence detector, said method for encoding comprising the steps of:

(a) encoding a predetermined j number of bits from the data stream of binary data into a codeword comprising a predetermined k number of bits; and (b) generating a parity signal having two states, active and inactive, responsive to the number of "1" bits in at least part of at least one codeword generated in step (a), said encoding in step (a) utilizing the parity signal for encoding the input stream of binary data into the codewords, wherein:

(a) the codewords generated are selected from a first and second plurality of codewords;

(b) the sequence detector comprises four path memories;

(c) the four path memories merge into a single survivor sequence comprising at least k bits after the sequence detector processes a predetermined first N number of bits out of the codewords selected from the first plurality of codewords; and (d) the four path memories merge into two survivor sequences comprising at least k bits each and different in only one bit after the sequence detector processes the first N number of bits out of the codewords selected from the second plurality of codewords.

30. The method as recited in claim 29, wherein j is 8, k is 9, and N is 3.

31. The method as recited in claim 29, wherein:

(a) the second plurality of codewords comprises a third and fourth plurality of codewords;

(b) the codewords out of the third plurality of codewords have at least one "1" bit in the even interleave and zero "1" bits in the odd interleave within the first N bit positions of the codeword;

(c) the codewords out of the fourth plurality of codewords have at least one "1" bit in the odd interleave and zero "1" bits in the even interleave within the first N bit positions of the codeword;

(d) the encoder generates codewords out of the third plurality of codewords if the parity signal is active; and (e) the encoder generates codewords out of the fourth plurality of codewords if the parity signal is inactive.

32. The method as recited in claim 29, wherein:

(a) the second plurality of codewords comprises a third, fourth, fifth, and sixth plurality of codewords;

(b) the codewords out of the third plurality of codewords having a {0, 0, 1} bit sequence as the first three bits;

(c) the codewords out of the fourth plurality of codewords having a {0, 1, 0} bit sequence as the first three bits;

(d) the codewords out of the fifth plurality of codewords having a {1, 0, 0} bit sequence as the first three bits;

(e) the codewords out of the sixth plurality of codewords having a {1, 0, 1} bit sequence as the first three bits;

(f) the encoder generates codewords out of the third and fourth plurality of codewords if the parity signal is active; and (g) the encoder generates codewords out of the fifth and sixth plurality of codewords if the parity signal is inactive.

33. A method for encoding a stream of binary data into a stream of binary codewords utilized in PRML communication channels, said PRML communication channel comprising at least one sequence detector, said method for encoding comprising the steps of:

(a) encoding a predetermined j number of bits from the data stream of binary data into a codeword comprising a predetermined k number of bits; and (b) generating a parity signal having two states, active and inactive, responsive to the number of "1" bits in at least part of at least one codeword generated in step (a), said encoding in step (a) utilizing the parity signal for encoding the input stream of binary data into the codewords, wherein:

(a) the codewords generated are selected from a first and second plurality of codewords;

(b) the sequence detector comprises a first and second sliding threshold sequence detector having two path memories each, the first and second sequence detectors processing the even and odd interleaves of the binary data stream respectively;

(c) the two path memories merge into a first and second survivor sequence comprising a total of at least k bits after the sequence detectors process a predetermined first N number of bits out of the codewords selected from the first plurality of codewords; and (d) one of the path memories does not merge into the corresponding survivor sequence after the sequence detectors process the first N number of bits out of the codewords selected from the second plurality of codewords.

34. The method as recited in claim 33, wherein N is 3.

35. The method as recited in claim 33, wherein:

(a) the second plurality of codewords comprises a third and fourth plurality of codewords;

(b) the codewords out of the third plurality of codewords have at least one "1" bit in the even interleave and zero "1" bits in the odd interleave within the first N bit positions of the codeword;

(c) the codewords out of the fourth plurality of codewords have at least one "1" bit in the odd interleave and zero "1" bits in the even interleave within the first N bit positions of the codeword;

(d) the encoder generates codewords out of the third plurality of codewords if the parity signal is active; and (e) the encoder generates codewords out of the fourth plurality of codewords if the parity signal is inactive.

36. The method as recited in claim 33, wherein:

(a) the second plurality of codewords comprises a third, fourth, fifth, and sixth plurality of codewords;

(b) the codewords out of the third plurality of codewords having a {0, 0, 1} bit sequence as the first three bits;

(c) the codewords out of the fourth plurality of codewords having a {0, 1, 0} bit sequence as the first three bits;

(d) the codewords out of the fifth plurality of codewords having a {1, 0, 0} bit sequence as the first three bits;

(e) the codewords out of the sixth plurality of codewords having a {1, 0, 1} bit sequence as the first three bits;

(f) the encoder generates codewords out of the third and fourth plurality of codewords if the parity signal is active; and (g) the encoder generates codewords out of the fifth and sixth plurality of codewords if the parity signal is inactive.

37. A method for encoding a stream of binary data into a stream of binary codewords utilized in PRML communication channels, said PRML communication channel comprising at least one sequence detector, said method for encoding comprising the steps of:

(a) encoding a predetermined j number of bits from the data stream of binary data into a codeword comprising a predetermined k number of bits; and (b) generating a parity signal having two states, active and inactive, responsive to the number of "1" bits in at least part of at least one codeword generated in step (a), said encoding in step (a) utilizing the parity signal for encoding the input stream of binary data into the codewords, wherein:

(a) the sequence detector comprises four path memories; and (b) the codewords generated are selected from a first and second plurality of codewords such that when a "1" bit out of at least one of the codewords is changed to a "0":

(a) the four path memories merge into a single survivor sequence comprising at least k bits after the sequence detector processes a predetermined first M number of bits out of the codewords selected from the first plurality of codewords; and (b) the four path memories merge into two survivor sequences comprising at least k bits each and different in only one bit after the sequence detector processes the first M number of bits out of the codewords selected from the second plurality of codewords.

38. The method as recited in claim 37, wherein j is 8, k is 9, and M is 9.

39. The method as recited in claim 37, wherein:

(a) the second plurality of codewords comprises a third and fourth plurality of codewords;

(b) the codewords out of the third plurality of codewords have at least one "1" bit in the even interleave and less than two "1" bits in the odd interleave within the first M bit positions of the codeword;

(c) the codewords out of the fourth plurality of codewords have at least one "1" bit in the odd interleave and less than two "1" bits in the even interleave within the first M bit positions of the codeword;

(d) the encoder generates codewords out of the third plurality of codewords if the parity signal is active; and (e) the encoder generates codewords out of the fourth plurality of codewords if the parity signal is inactive.

40. A method for encoding a stream of binary data into a stream of binary codewords utilized in PRML communication channels, said PRML communication channel comprising at least one sequence detector, said method for encoding comprising the steps of:

(a) encoding a predetermined j number of bits from the data stream of binary data into a codeword comprising a predetermined k number of bits; and (b) generating a parity signal having two states, active and inactive, responsive to the number of "1" bits in at least part of at least one codeword generated in step (a), said encoding in step (a) utilizing the parity signal for encoding a the input stream of binary data into the codewords, wherein:

(a) the binary data stream comprising an even and odd interleave subsequence, the odd interleave consisting only of odd bit positions of the binary data stream and the even interleave consisting of even bit positions of the binary data stream;

(b) the sequence detector comprises a first and second sliding threshold sequence detector having two path memories each, the first and second sequence detectors processing the even and odd interleaves of the binary data stream respectively; and (c) the codewords generated are selected from a first and second plurality of codewords such that when a "1" bit out of at least one of the codewords is changed to a "0":

(a) the two path memories of both sequence detectors merge into a corresponding first and second survivor sequence comprising a total of at least k bits after the sequence detectors process a predetermined first M number of bits out of the codewords selected from the first plurality of codewords; and (b) one of the path memories does not merge into the corresponding survivor sequence after the sequence detectors process the first M number of bits out of the codewords selected from the second plurality of codewords.

41. The method as recited in claim 40, wherein j is 8, k is 9, and M is 9.

42. The method as recited in claim 40, wherein:

(a) the second plurality of codewords comprises a third and fourth plurality of codewords;

(b) the codewords out of the third plurality of codewords have at least one "1" bit in the even interleave and less than two "1" bits in the odd interleave within the first M bit positions of the codeword;

(c) the codewords out of the fourth plurality of codewords have at least one "1" bit in the odd interleave and less than two "1" bits in the even interleave within the first M bit positions of the codeword;

(d) the encoder generates codewords out of the third plurality of codewords if the parity signal is active; and (e) the encoder generates codewords out of the fourth plurality of codewords if the parity signal is inactive.

* * * * *

UNITED STATES PATENT AND TRADEMARK OFFICE
CERTIFICATE OF CORRECTION

PATENT NO : 5,544,178
DATED : Aug. 6, 1996
INVENTOR(S) : Zook

It is certified that error appears in the above-identified patent and that said Letters Patent is hereby corrected as shown below:

On col. 2, line 4, the phrase "Because he PRML" should read --Because the PRML--. On col. 2, line 16, the phrase "March 1973," should read --March 1973.--. On col. 3, line 47, the phrase "knowing he parity" should read --knowing the parity--. On col. 14, line 25, the phrase "paths am the output" should read --paths as the output--. On col. 20, line 24, the phrase "codewords, comprising;" should read --codewords, comprising:--. On col. 21, line 13, the phrase "binary codewords; an" should read --binary codewords; and--.

Signed and Sealed this

Sixth Day of May, 1997

Attest:

Attesting Officer

BRUCE LEHMAN

Commissioner of Patents and Trademarks